(12) United States Patent
Tabata et al.

(10) Patent No.: US 10,153,765 B2
(45) Date of Patent: Dec. 11, 2018

(54) SIGNAL GENERATION DEVICE

(71) Applicant: Panasonic Corporation, Osaka (JP)

(72) Inventors: Osamu Tabata, Osaka (JP); Shuichi Nagai, Osaka (JP); Yasufumi Kawai, Osaka (JP)

(73) Assignee: PANASONIC CORPORATION, Osaka (JP)

(*) Notice: Subject to any disclaimer, the term of this patent is extended or adjusted under 35 U.S.C. 154(b) by 34 days.

(21) Appl. No.: 15/411,429

(22) Filed: Jan. 20, 2017

(65) Prior Publication Data

US 2017/0230047 A1 Aug. 10, 2017

(30) Foreign Application Priority Data

Feb. 8, 2016 (JP) .................................. 2016-021640

(51) Int. Cl.
| | |
|---|---|
| *H03K 17/687* | (2006.01) |
| *H01F 38/14* | (2006.01) |
| *G08C 17/00* | (2006.01) |
| *H01F 19/08* | (2006.01) |
| *H02M 5/02* | (2006.01) |

(52) U.S. Cl.
CPC .......... *H03K 17/687* (2013.01); *G08C 17/00* (2013.01); *H01F 19/08* (2013.01); *H01F 38/14* (2013.01); *H02M 5/02* (2013.01); *H01F 2019/085* (2013.01)

(58) Field of Classification Search
CPC ...... H03K 17/687; G08C 17/00; H01F 19/08; H01F 2019/085; H01F 38/14; H02M 5/02

USPC .................................................. 327/108–122
See application file for complete search history.

(56) References Cited

U.S. PATENT DOCUMENTS

| | | | |
|---|---|---|---|
| 2016/0226299 A1* | 8/2016 | Nam ....................... | H02J 7/042 |
| 2017/0288462 A1* | 10/2017 | Suzuki .................... | H02J 50/90 |

FOREIGN PATENT DOCUMENTS

| | | |
|---|---|---|
| JP | 11-341711 | 12/1999 |
| JP | 2006-060909 | 3/2006 |
| JP | 2012-257421 | 12/2012 |

* cited by examiner

*Primary Examiner* — Dinh T Le
(74) *Attorney, Agent, or Firm* — McDermott Will & Emery LLP

(57) ABSTRACT

A signal generation device, including: an insulation element having transmission and reception units, and isolatedly transmitting an input wave introduced to the transmission unit, to thereby output an output wave from the reception unit; a power unit generating a voltage according to the output wave; a terminal having an output signal corresponding to the voltage; a generation unit generating a control signal; an insulation unit isolatedly transmitting the control signal, and generating a drive signal according to the control signal; a selection unit selecting whether to output the output signal to the terminal, according to the drive signal; a detection unit generating a detection signal indicating the state of the output signal, according to a detection wave obtained from the transmission unit; and a control signal adjustment unit adjusting the control signal according to the detection signal, the output signal being adjusted according to the adjustment of the control signal.

11 Claims, 18 Drawing Sheets

SIGNAL GENERATION DEVICE

BACKGROUND

1. Technical Field

The present disclosure relates to a signal generation device.

2. Description of the Related Art

Japanese Unexamined Patent Application Publication No. 2012-257421 discloses a signal transmission device in which an abnormality pulse signal transmitted from a second circuit is transmitted to a first circuit using an insulation element for transmitting abnormality pulse signals.

SUMMARY

In the prior art, it is not possible to reduce the size of the signal generation device.

In one general aspect, the techniques disclosed here feature a signal generation device that includes: a first insulation element that includes a transmission unit and a reception unit, and isolatedly transmits an input wave that is input to the transmission unit, to thereby output an output wave from the reception unit; a power source unit that generates a power source voltage on the basis of the output wave; an output terminal that is a terminal to which an output signal having a voltage corresponding to the power source voltage is output; a control signal generation unit that generates a control signal; an insulation unit that isolatedly transmits the control signal, and generates a drive signal on the basis of the isolatedly transmitted control signal; an output selection unit that selects whether or not the output signal is to be output to the output terminal, on the basis of the drive signal; a first detection unit that generates a first detection signal indicating the state of the output signal, on the basis of a detection wave obtained from the transmission unit; and a control signal adjustment unit that performs an adjustment of the control signal in accordance with the first detection signal, in which the output signal is adjusted in accordance with the adjustment of the control signal by the control signal adjustment unit.

According to the present disclosure, it is possible to reduce the size of a signal generation device.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Hereafter, embodiments of the present disclosure will be described with reference to the drawings.

(Embodiment 1)

Figure 1:
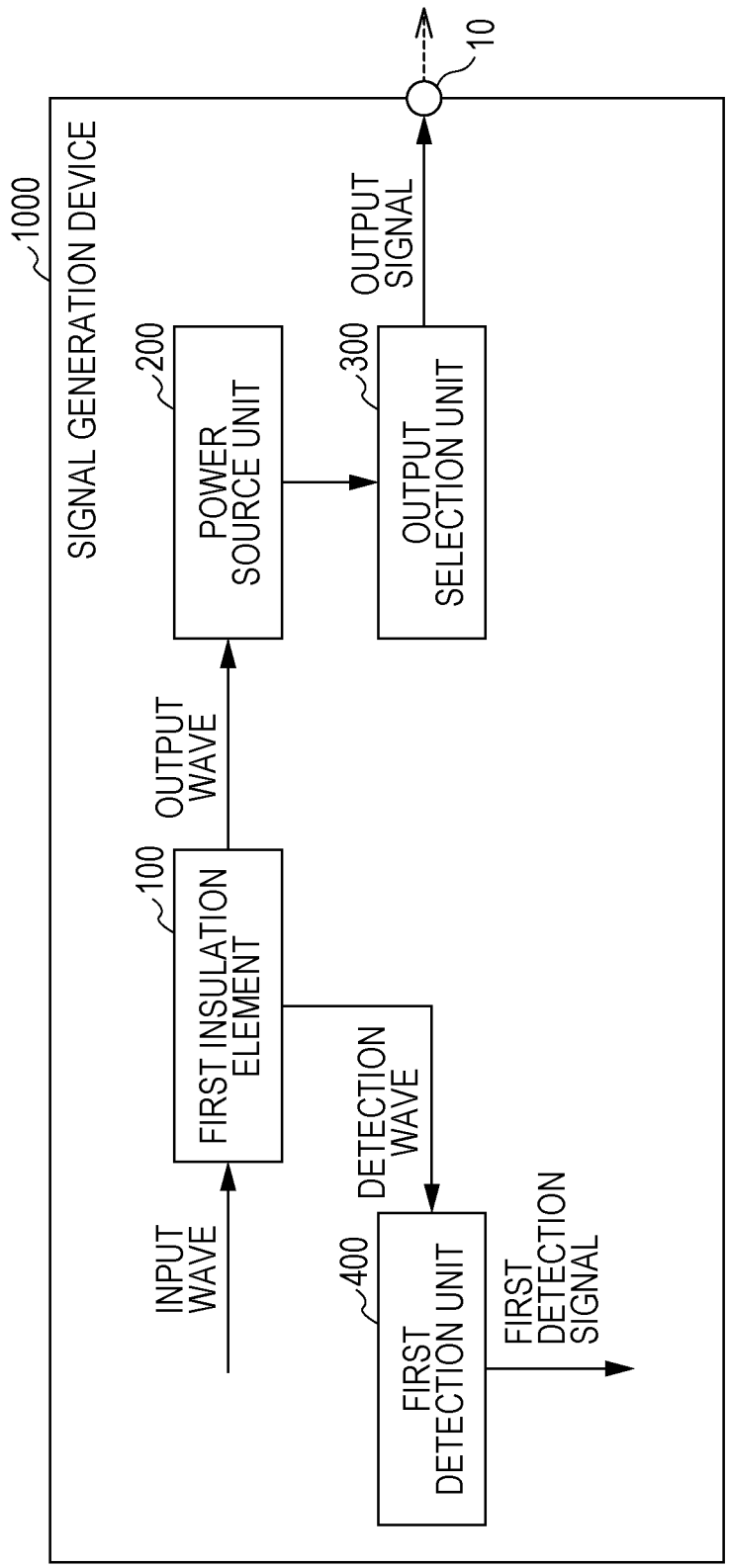
FIG. 1 is a drawing depicting a schematic configuration of a signal generation device in embodiment 1.

FIG. 1 is a drawing depicting a schematic configuration of a signal generation device 1000 in embodiment 1.

The signal generation device 1000 in embodiment 1 is provided with (i.e., includes) a first insulation element 100, a power source unit 200, an output terminal 10, an output selection unit 300, and a first detection unit 400.

The first insulation element 100 is includes a transmission unit 101 (e.g., transmission portion) and a reception unit 102 (e.g., reception portion). The first insulation element 100 isolatedly transmits (i.e., transmits with electronical isolation) an input wave that is input to the transmission unit 101, to thereby output an output wave from the reception unit 102.

The power source unit 200 generates a power source voltage on the basis of the output wave.

The output terminal 10 is a terminal to which an output signal having a voltage corresponding to the power source voltage is output.

The output selection unit 300 selects whether or not the output signal is to be output to the output terminal 10.

The first detection unit 400 generates a first detection signal that indicates the state of the output signal, on the basis of a detection wave obtained from the transmission unit 101.

According to the aforementioned configuration, on the primary side (the transmission side for insulation and transmission) of the circuitry of the signal generation device, it is possible to detect a change in the output signal (for example, the occurrence of an abnormality such as a low voltage state, or the like) on the secondary side (the reception side for insulation and transmission). Thus, on the primary side, it is possible to implement an adjustment corresponding to the change in the output signal, for example. Furthermore, for example, there is no need for an insulation transmission path (for example, a separate insulation element, or the like) merely for sending, to the primary side, a signal indicating that an abnormality has occurred in the output signal. Consequently, it is possible to reduce the size of the signal generation device.

The details of the aforementioned effect are described below with reference to a comparative example.

Figure 18:
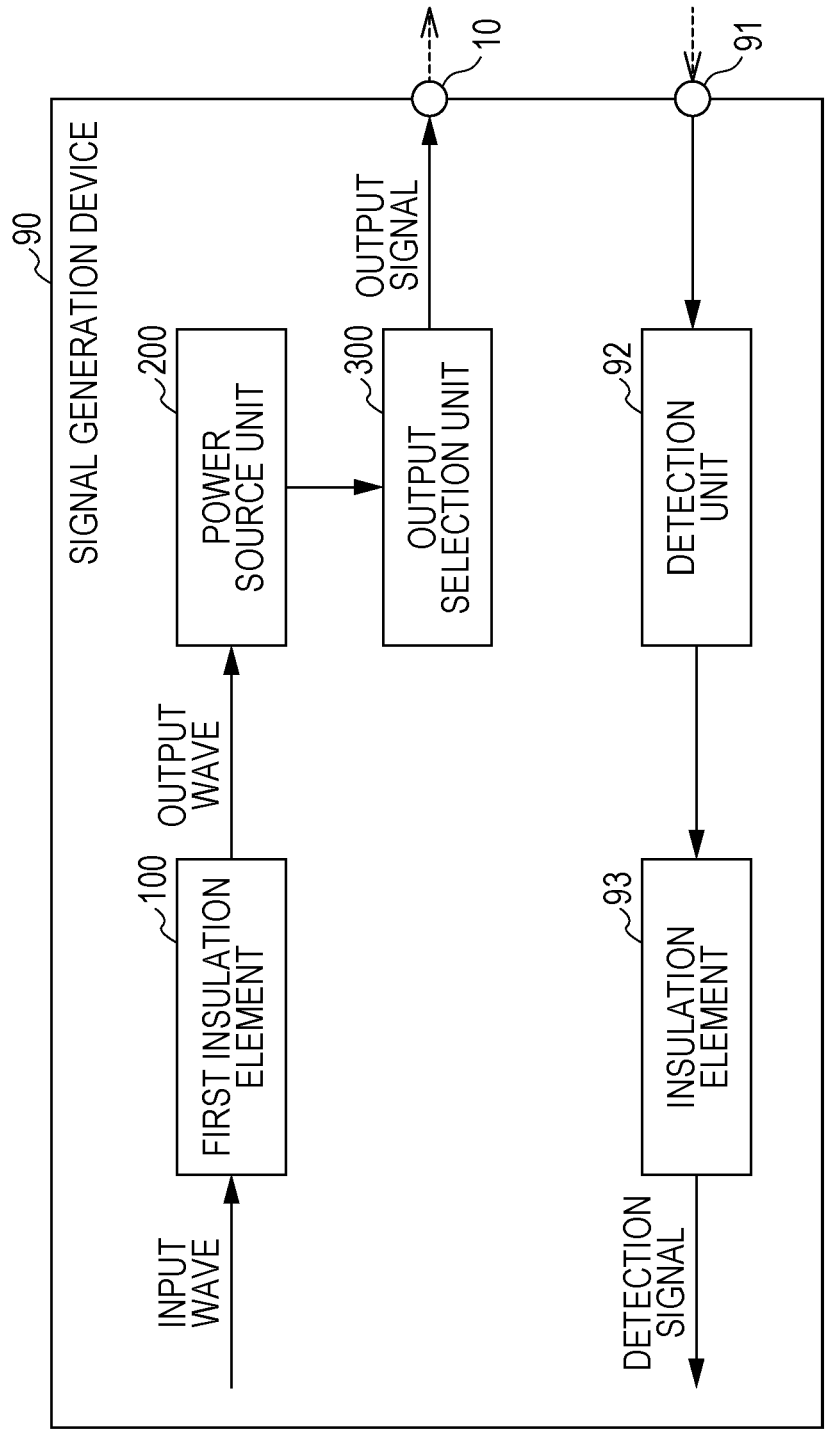
FIG. 18 is a drawing depicting a schematic configuration of a signal generation device in a comparative example.

FIG. 18 is a drawing depicting a schematic configuration of a signal generation device 90 in a comparative example.

The signal generation device 90 in the comparative example includes a first insulation element 100, a power source unit 200, an output terminal 10, an output selection unit 300, a secondary-side input terminal 91, a detection unit 92, and an insulation element 93.

A signal, which is obtained from an external circuit to which the output signal is input, is input to the secondary-side input terminal 91.

The detection unit 92 detects the signal from the secondary-side input terminal 91. Furthermore, the detection unit 92 outputs the detected signal to the insulation element 93.

The insulation element 93 isolatedly transmits, to the primary side, the signal from the detection unit 92. The signal isolatedly transmitted to the primary side becomes a detection signal.

As described above, in the comparative example, an abnormality in the output signal is detected on the secondary side. Therefore, in the comparative example, there is a need for an insulation transmission path (for example, the insulation element 93, or the like) merely for sending, to the primary side, a signal indicating that an abnormality has occurred in the output signal. Consequently, in the comparative example, a problem occurs in that there is an increase in circuit scale and cost.

In contrast, in the signal generation device in embodiment 1, a change in the output signal on the secondary side (for example, an abnormality in the output signal, or the like) is detected on the primary side using the first insulation element 100 that transmits, to the secondary side, the input wave that is input from the primary side. Consequently, with the signal generation device in embodiment 1, there is no need for a dedicated insulation transmission path for transmitting, to the primary side, an abnormality in the power source voltage on the secondary side. Therefore, with the signal generation device in embodiment 1, a change in the output signal on the secondary side can be detected on the primary side without increasing the circuit scale.

The first detection signal output by the first detection unit 400 may be used to adjust the output signal. For example, the outputting of the output signal may be stopped on the basis of the first detection signal output by the first detection unit 400.

Alternatively, the first detection signal output by the first detection unit 400 may be transmitted inside or outside of the signal generation device 1000. At such time, some kind of notification (for example, a notification indicating that an abnormality has occurred in the output signal, or the like) may be carried out on the basis of this transmitted first detection signal.

Alternatively, a circuit having an under voltage lock-out (UVLO) function using the first detection signal output by the first detection unit 400 may be configured.

In the signal generation device in embodiment 1, a detection signal is obtained on the primary side. It is thereby possible to not only stop the outputting of the output signal on the secondary side but also to simultaneously control the voltage value of the power source voltage on the secondary side.

An insulation element with which the state of the transmission unit 101 (for example, the state of reflected waves, the resonance state among resonators, or the like) changes according to the output state on the secondary side can be used as the first insulation element 100, for example. An electromagnetic resonance coupler, a transformer, or the like can be used as the first insulation element 100, for example.

A power wave that can be isolatedly transmitted by the first insulation element 100 can be used as the input wave, for example. The input wave may be a high-frequency wave, for example. The high-frequency wave may be high-frequency power having a frequency of 1 MHz or higher.

The input wave may be input from outside of the signal generation device 1000. Alternatively, the signal generation device 1000 itself may include a means for generating an input wave (for example, a high-frequency wave generation unit 40 described hereinafter, or the like).

A configuration depicted in FIG. 4 or 5 described hereinafter, for example, is used as the power source unit 200.

A configuration depicted in FIG. 4 or 5 described hereinafter, for example, is used as the output selection unit 300.

A configuration depicted in FIGS. 2 to 5 described hereinafter, for example, is used as the first detection unit 400.

The output terminal 10, for example, may be connected to a switching element 30 (for example, a power semiconductor transistor), a load, or the like.

The output signal, for example, may be a gate drive signal that is input to a conduction control terminal (for example, the gate terminal) of the switching element 30 connected to the output terminal 10. At such time, the signal generation device 1000 may be configured as a gate driver (gate drive circuit) for the switching element 30. In other words, the on/off state of the switching element 30 may be switched according to the voltage value of the output signal that is output by the signal generation device 1000.

Figure 2:
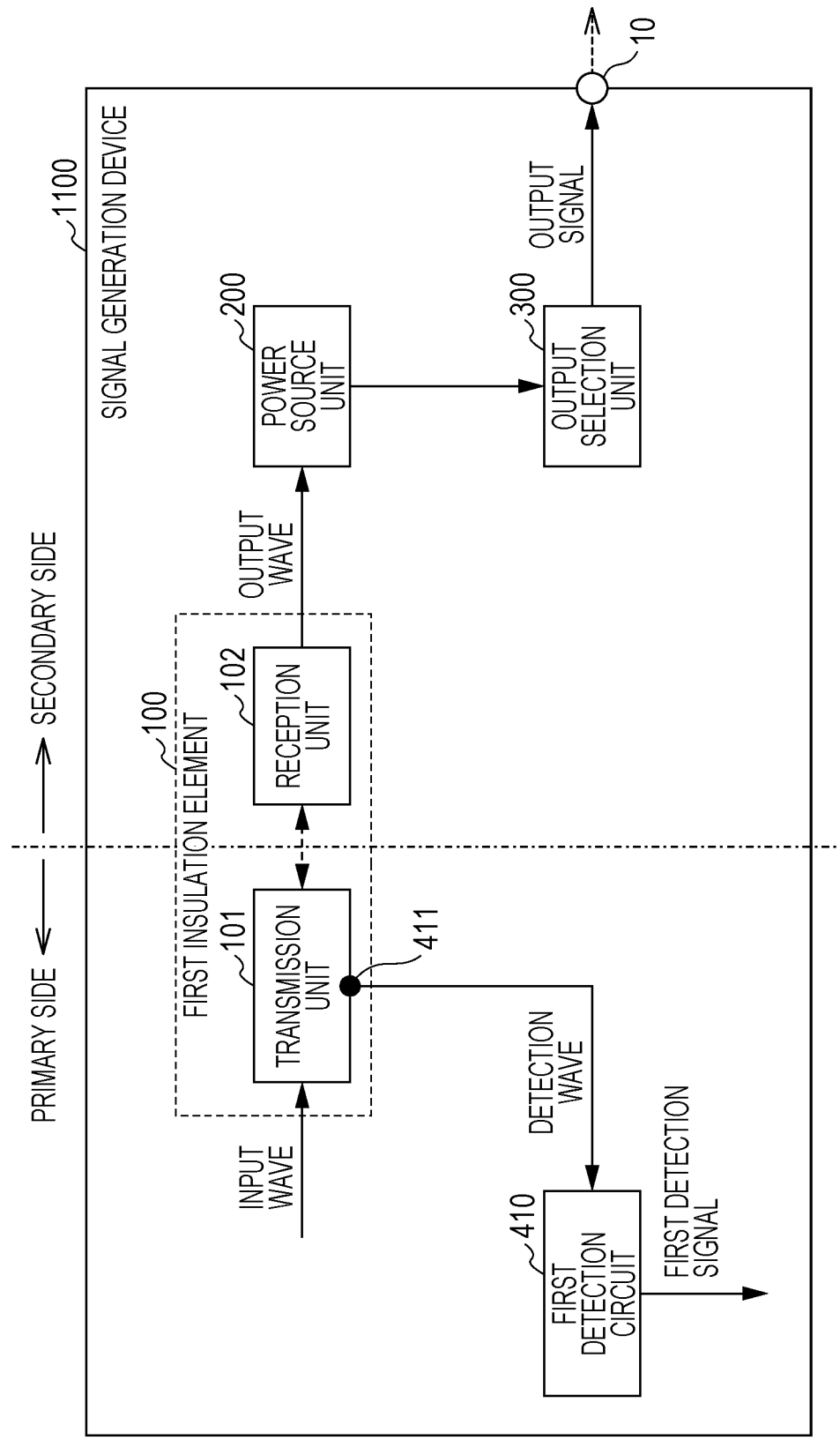
FIG. 2 is a drawing depicting a schematic configuration of a signal generation device in embodiment 1.

FIG. 2 is a drawing depicting a schematic configuration of a signal generation device 1100 in embodiment 1.

In addition to the aforementioned configuration of the signal generation device 1000, the signal generation device 1100 in embodiment 1 is also provided with the configuration described hereinafter.

In other words, in the signal generation device 1100 in embodiment 1, the first detection unit 400 includes a first detection circuit 410.

The first detection circuit 410 includes a first detection terminal 411.

The first detection terminal 411 is connected to the transmission unit 101.

The first detection circuit 410 generates a first detection signal on the basis of a detection wave that is input from the first detection terminal 411.

According to the aforementioned configuration, changes in the state of the transmission unit of the first insulation element can be detected with greater precision. Consequently, changes in the output signal (for example, the occurrence of an abnormality, or the like) can be detected with greater precision.

As depicted in FIG. 2, the signal generation device 1100 includes, on the primary side thereof (the transmission side for insulation and transmission), the first detection unit 400 (the first detection circuit 410 and the first detection terminal 411) and the transmission unit 101.

Furthermore, as depicted in FIG. 2, the signal generation device 1100 includes, on the secondary side thereof (the reception side for insulation and transmission), the reception unit 102, the power source unit 200, the output selection unit 300, and the output terminal 10.

Figure 3:
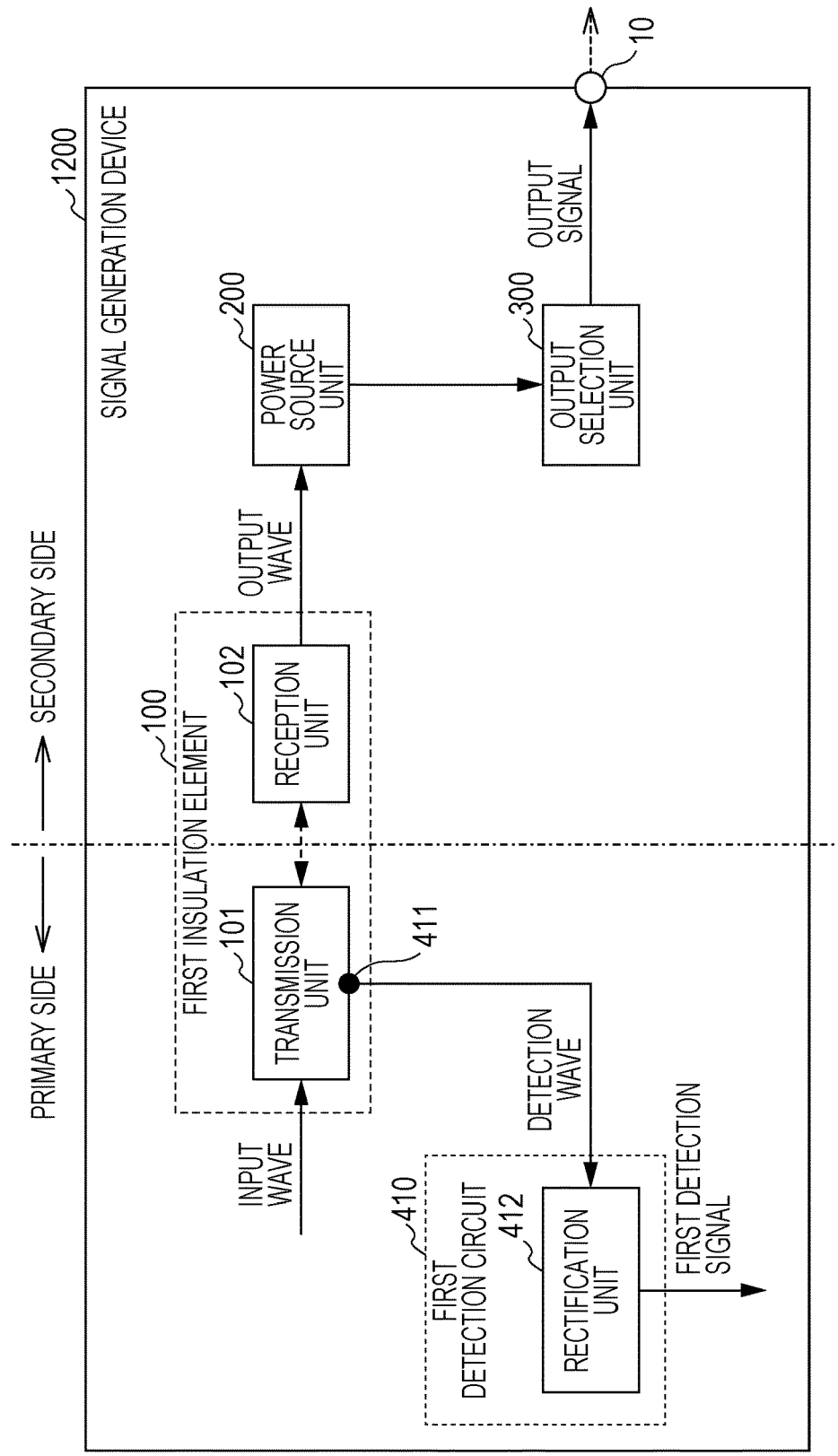
FIG. 3 is a drawing depicting a schematic configuration of a signal generation device in embodiment 1.

FIG. 3 is a drawing depicting a schematic configuration of a signal generation device 1200 in embodiment 1.

In addition to the aforementioned configuration of the signal generation device 1100, the signal generation device 1200 in embodiment 1 is also provided with the configuration described hereinafter.

More specifically, in the signal generation device 1200 in embodiment 1, the input wave is a high-frequency wave. Therefore, a high-frequency wave component is included in the detection wave.

The first detection circuit 410 includes a rectification unit 412.

The first detection circuit 410 generates a first detection signal by the high-frequency wave component included in the detection wave being rectified by the rectification unit 412.

According to the aforementioned configuration, the state of the transmission unit of the first insulation element changes in a more notable manner in response to changes in the output signal. Therefore, changes in the state of the transmission unit of the first insulation element can be detected with greater precision. Consequently, changes in the output signal (for example, the occurrence of an abnormality, or the like) can be detected with greater precision.

A configuration depicted in FIG. 5 described hereinafter, for example, is used as the rectification unit 412.

It should be noted that the first detection circuit 410 may also include a comparator, an amplifier, or the like.

Figure 4:
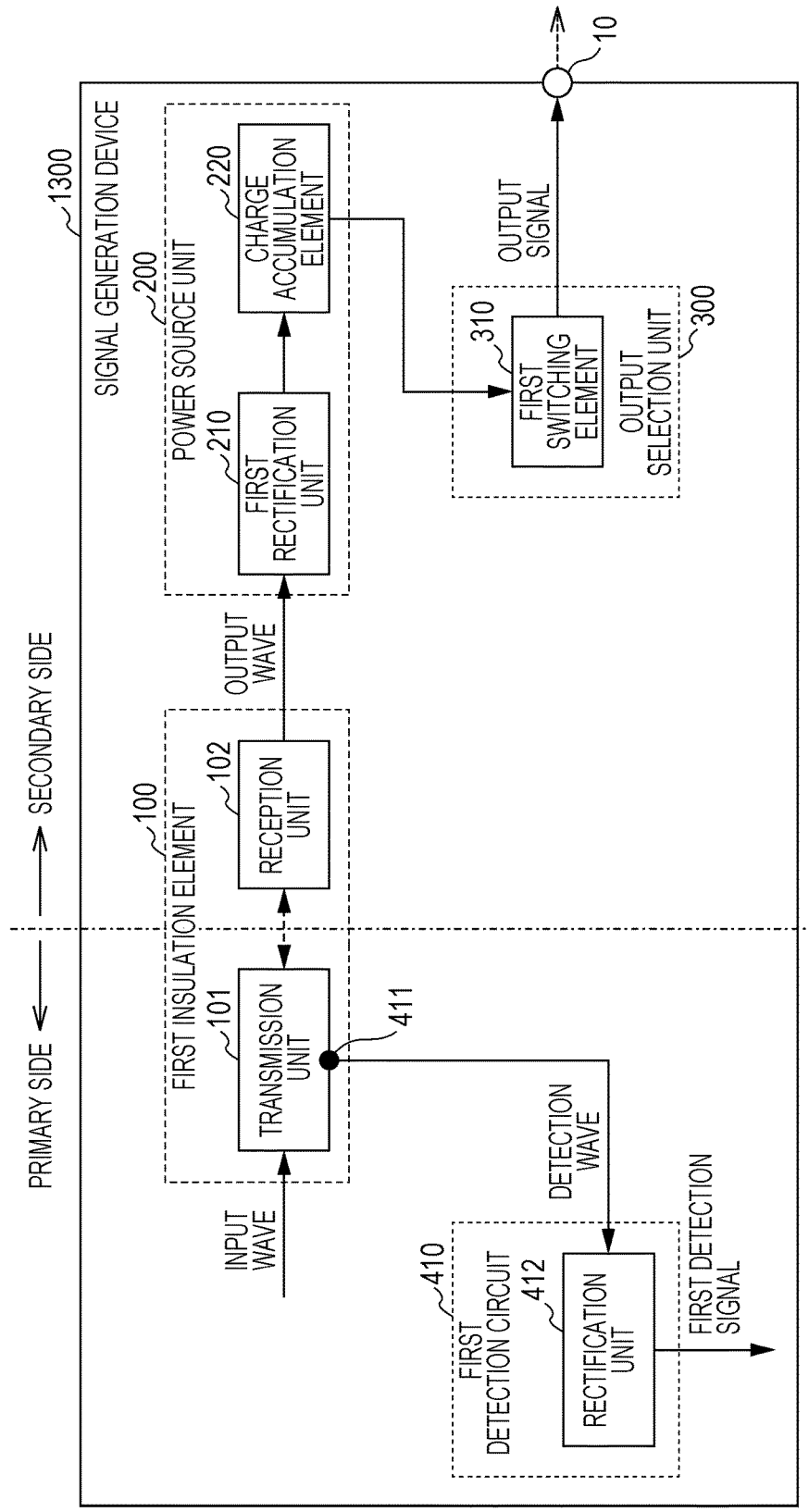
FIG. 4 is a drawing depicting a schematic configuration of a signal generation device in embodiment 1.

FIG. 4 is a drawing depicting a schematic configuration of a signal generation device 1300 in embodiment 1.

In addition to the aforementioned configuration of the signal generation device 1200, the signal generation device 1300 in embodiment 1 is also provided with the configuration described hereinafter.

More specifically, in the signal generation device 1300 in embodiment 1, the input wave is a high-frequency wave.

The power source unit 200 includes a first rectification unit 210 and a charge accumulation element 220.

The first rectification unit 210 rectifies the output wave to thereby generate a charging voltage.

The charge accumulation element 220 is charged by the charging voltage.

In the signal generation device 1300 in embodiment 1, the power source voltage generated by the power source unit 200 is the discharge voltage of the charge accumulation element 220.

The output selection unit 300 includes a first switching element 310.

The conducting/non-conducting state between the charge accumulation element 220 and the output terminal 10 changes according to the on/off state of the first switching element 310.

When the charge accumulation element 220 and the output terminal 10 are in the conducting state, an output signal is output from the output terminal 10.

According to the aforementioned configuration, changes in the output signal occur due to changes in the discharge voltage of the charge accumulation element. Consequently, the state of the transmission unit of the first insulation element changes in response to changes in the discharge voltage of the charge accumulation element. Consequently, changes in the state of the transmission unit of the first insulation element can be detected with greater precision. Consequently, changes in the output signal (for example, the occurrence of an abnormality, or the like) can be detected with greater precision.

A configuration depicted in FIG. 5 described hereinafter, for example, is used as the first rectification unit 210.

A capacitor or the like can be used as the charge accumulation element 220, for example.

A transistor or the like can be used as the first switching element 310, for example. At such time, a drive signal may be input to a conduction control terminal (for example, the gate terminal) of the first switching element 310, for the on/off state to be switched. A configuration depicted in FIGS. 6 to 8 described hereinafter, for example, may be used as a method for generating the drive signal.

Figure 5:
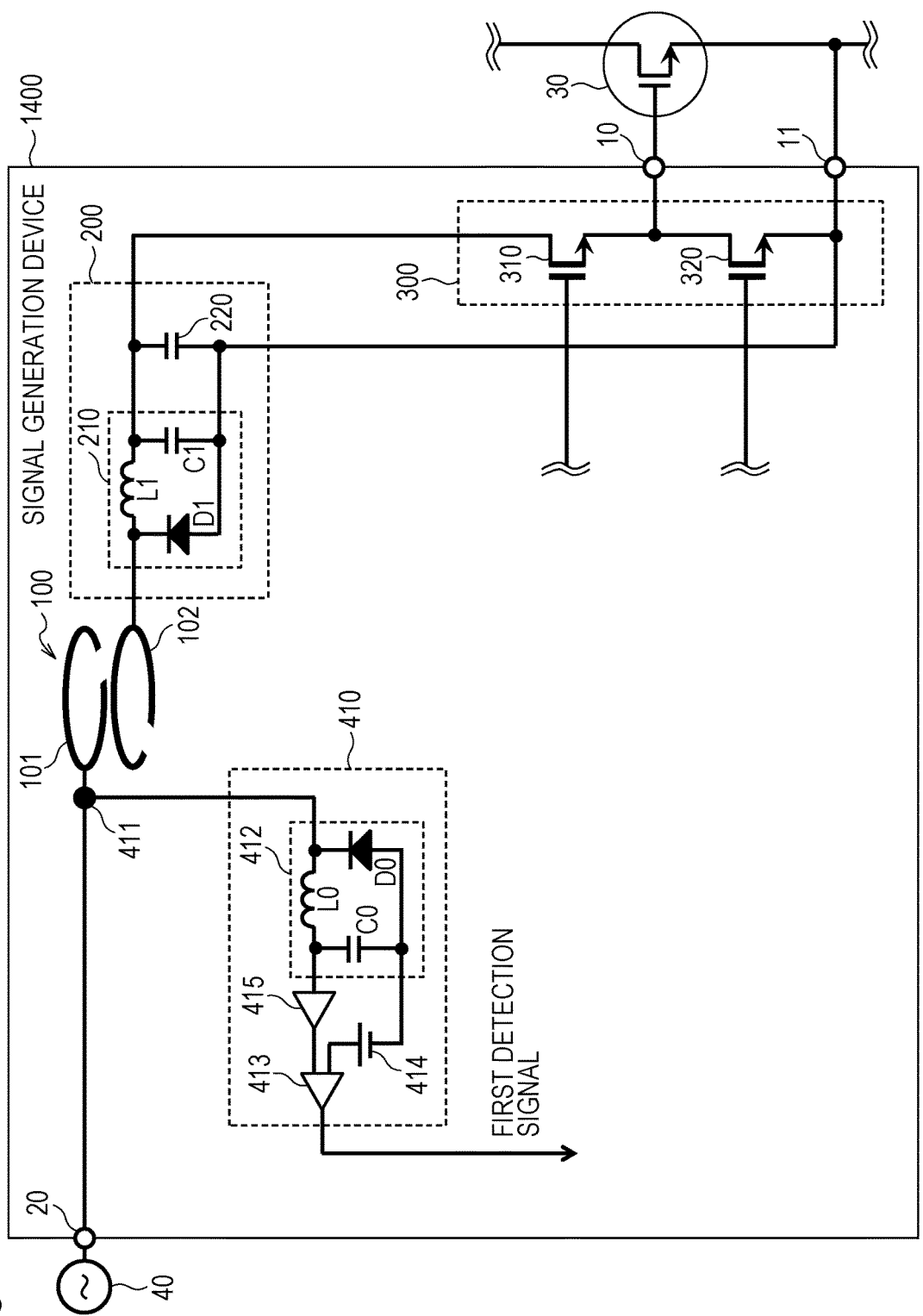
FIG. 5 is a drawing depicting a schematic configuration of a signal generation device in embodiment 1.

FIG. 5 is a drawing depicting a schematic configuration of a signal generation device 1400 in embodiment 1.

In addition to the aforementioned configuration of the signal generation device 1300, the signal generation device 1400 in embodiment 1 is also provided with the configuration described hereinafter.

More specifically, in the signal generation device 1400 in embodiment 1, the input wave is a high-frequency wave.

The first insulation element 100 is an electromagnetic resonance coupler. The electromagnetic resonance coupler includes a transmission-side wiring and a reception-side wiring. The reception-side wiring opposes the transmission-side wiring.

In the signal generation device 1400 in embodiment 1, the transmission unit 101 (e.g., transmission portion) is the transmission-side wiring. Furthermore, the reception unit 102 (e.g., reception portion) is the reception-side wiring.

According to the aforementioned configuration, the state of the transmission unit of the first insulation element (for example, the state of a wave reflected from the reception-side wiring to the transmission-side wiring, or the like) changes in a more notable manner in response to changes in the output signal. Therefore, changes in the state of the transmission unit of the first insulation element can be detected with greater precision. Consequently, changes in the output signal (for example, the occurrence of an abnormality, or the like) can be detected with greater precision.

The electromagnetic resonance coupler isolatedly transmits (non-contact transmission) signals to be transmitted, by means of electromagnetic resonance coupling, between the transmission-side wiring and the reception-side wiring.

The transmission-side wiring and the reception-side wiring are provided separated by a fixed distance and opposing each other.

The transmission-side wiring and the reception-side wiring may be transmission lines having a circling shape formed of metal wiring.

The transmission-side wiring and the reception-side wiring may each have an open section in an arbitrary location of the wiring.

The transmission-side wiring and the reception-side wiring may each have a terminal section in an arbitrary location of the wiring. The inputting and outputting of signals to be transmitted to the wiring may be performed from these terminal sections.

The length of each of the transmission-side wiring and the reception-side wiring is approximately ½ a wavelength of the signal to be transmitted, for example.

The external contour of the transmission-side wiring and the reception-side wiring may be circular or rectangular.

In the configuration example depicted in FIG. 5, the signal generation device 1400 is also provided with an output reference terminal 11 and an input-wave input terminal 20.

The input-wave input terminal 20 is connected to the transmission-side wiring (the transmission unit 101 of the first insulation element 100) of the electromagnetic resonance coupler.

The output terminal 10 is connected to a conduction control terminal (for example, the gate terminal) of the switching element 30.

Furthermore, the output reference terminal 11 is connected to a terminal (for example, the source terminal) of the switching element 30.

In this way, the configuration example depicted in FIG. 5, as an example, indicates an example in which the output signal is output to the switching element 30.

In the configuration example depicted in FIG. 5, a high-frequency wave constituting an input wave is generated by the high-frequency wave generation unit 40. The high-frequency wave generated by the high-frequency wave generation unit 40 is input to the input-wave input terminal 20. Thus, a high-frequency wave constituting an input waves is input to the transmission-side wiring (the transmission unit 101 of the first insulation element 100) of the electromagnetic resonance coupler.

It should be noted that the high-frequency wave generation unit 40 may be provided external to the signal generation device 1400, as depicted in FIG. 5. Alternatively, the signal generation device 1400 itself may include the high-frequency wave generation unit 40.

In the signal generation device 1400 in embodiment 1, the first detection circuit 410 includes the first detection terminal 411, the rectification unit 412, a comparator 413, a reference voltage 414, and an amplifier 415.

The first detection terminal 411 is connected to the transmission-side wiring of the electromagnetic resonance coupler.

The rectification unit 412 is a rectifier circuit made up of a reactor L0, a diode D0, and a capacitor C0.

The rectification unit 412 rectifies a detection wave that is input from the first detection terminal 411.

The amplifier 415 amplifies the rectified signal produced by the rectification unit 412. It is thereby possible to increase the detection sensitivity for the detection signal even when the strength of the rectified signal is low, for example.

The comparator 413 compares the amplified signal produced by the amplifier 415 and the reference voltage 414 to thereby output a first detection signal.

In the signal generation device 1400 in embodiment 1, the power source unit 200 includes the first rectification unit 210 and the charge accumulation element 220 (capacitor).

The first rectification unit 210 is a rectifier circuit made up of a reactor L1, a diode D1, and a capacitor C1.

An input end of the first rectification unit 210 is connected to the reception-side wiring (the reception unit 102 of the first insulation element 100) of the electromagnetic resonance coupler.

A first end of the charge accumulation element 220 is connected to one output end of the first rectification unit 210.

A second end of the charge accumulation element 220 is connected to another output end of the first rectification unit 210.

In the signal generation device 1400 in embodiment 1, the output selection unit 300 includes the first switching element 310 and a second switching element 320.

Transistors or the like can be used as the first switching element 310 and the second switching element 320, for example. At such time, a drive signal may be input to each conduction control terminal (for example, the gate terminal) of the first switching element 310 and the second switching element 320, for the on/off states thereof to be switched. A configuration depicted in FIGS. 6 to 8 described hereinafter, for example, may be used as a method for generating the drive signals.

A first terminal (for example, the drain terminal) of the first switching element 310 is connected to a first terminal of the charge accumulation element 220.

A second terminal (for example, the source terminal) of the first switching element 310 is connected to a first terminal (for example, the drain terminal) of the second switching element 320.

A second terminal (for example, the source terminal) of the second switching element 320 is connected to a second terminal of the charge accumulation element 220.

The output terminal 10 is connected to a path that joins the second terminal (for example, the source terminal) of the first switching element 310 and the first terminal (for example, the drain terminal) of the second switching element 320.

Furthermore, the output reference terminal 11 is connected to a path that joins the second terminal (for example, the source terminal) of the second switching element 320 and the second terminal of the charge accumulation element 220.

Figure 6:
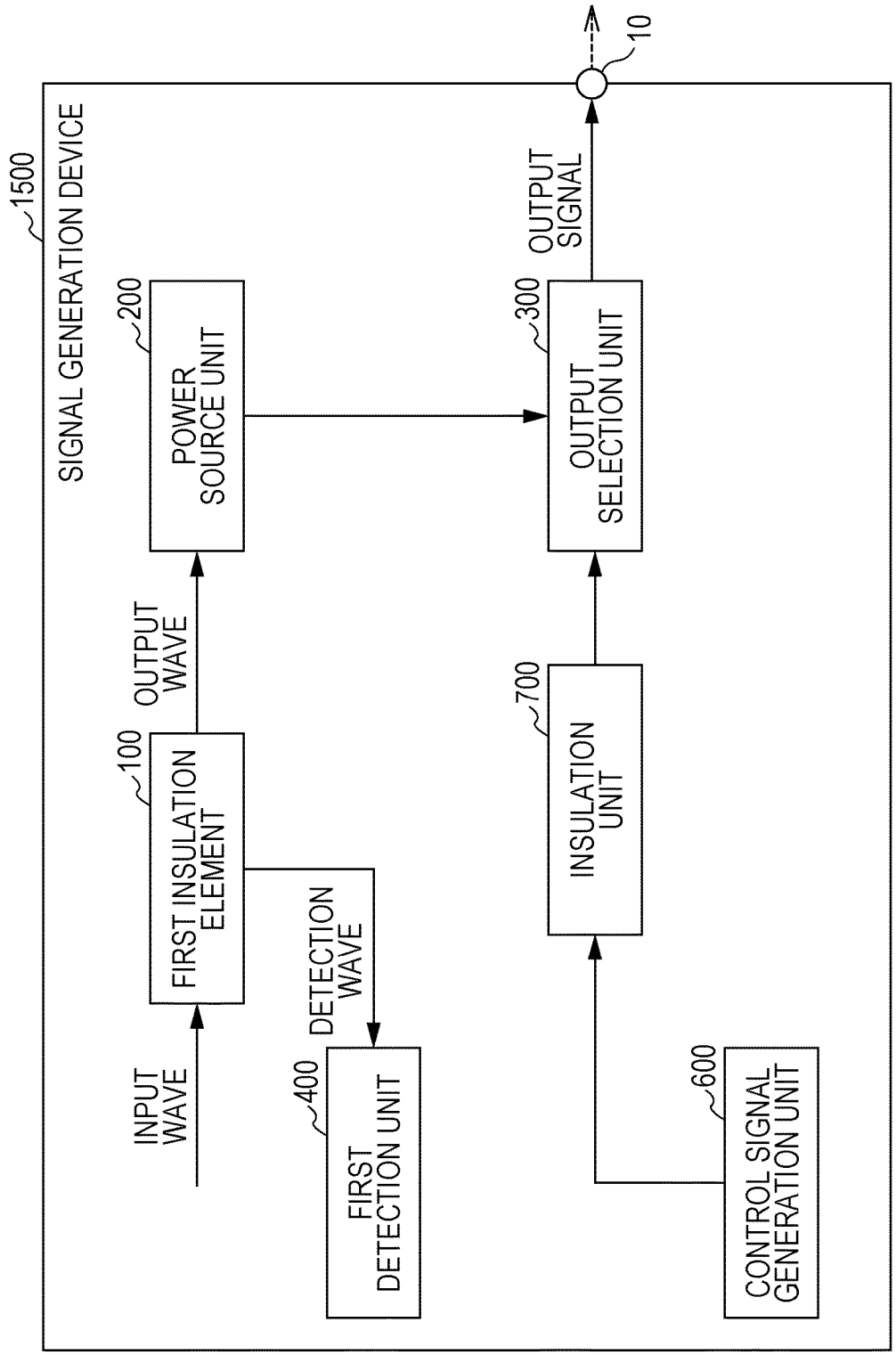
FIG. 6 is a drawing depicting a schematic configuration of a signal generation device in embodiment 1.

FIG. 6 is a drawing depicting a schematic configuration of a signal generation device 1500 in embodiment 1.

Hereinafter, with regard to FIG. 6, explanations of portions that are common to the aforementioned FIG. 1 are omitted as appropriate.

In addition to the aforementioned configuration of the signal generation device 1000, the signal generation device 1500 in embodiment 1 is also provided with the configuration described hereinafter.

More specifically, the signal generation device 1500 in embodiment 1 also includes a control signal generation unit 600 and an insulation unit 700.

The control signal generation unit 600 generates a control signal.

The control signal generation unit 600 may generate the control signal on the basis of an input signal that is input from outside of the signal generation device 1500. Alternatively, the control signal generation unit 600 itself may be a logic circuit (for example, a circuit made up of a CPU, a memory, and the like) that generates the control signal.

A configuration depicted in FIG. 7 or 8 described hereinafter, for example, is used as the control signal generation unit 600.

The insulation unit 700 isolatedly transmits the control signal, and generates a drive signal on the basis of the isolatedly transmitted control signal.

The insulation unit 700 may include an insulation element. An electromagnetic resonance coupler, a transformer, or the like can be used as the insulation element, for example.

The insulation unit 700 may also include a rectifier circuit or the like.

A configuration depicted in FIG. 7 or 8 described hereinafter, for example, is used as the insulation unit 700.

In the signal generation device 1500 in embodiment 1, the output selection unit 300 selects whether or not the output signal is to be output, on the basis of the drive signal generated by the insulation unit 700.

Figure 7:
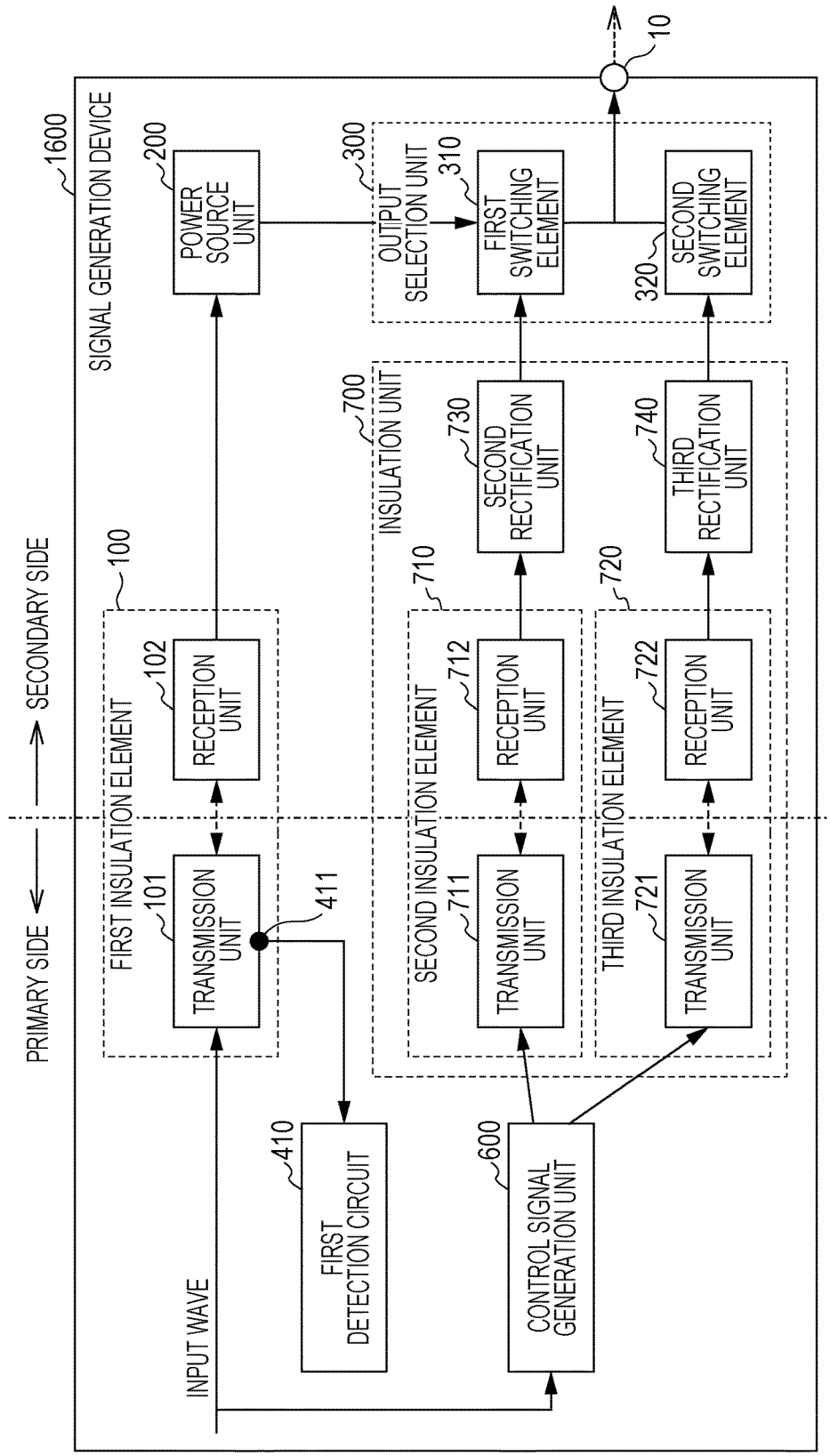
FIG. 7 is a drawing depicting a schematic configuration of a signal generation device in embodiment 1.

FIG. 7 is a drawing depicting a schematic configuration of a signal generation device 1600 in embodiment 1.

Hereinafter, with regard to FIG. 7, explanations of portions that are common to the aforementioned FIG. 2 are omitted as appropriate.

In addition to the aforementioned configuration of the signal generation device 1500, the signal generation device 1600 in embodiment 1 is also provided with the configuration described hereinafter.

More specifically, in the signal generation device 1600 in embodiment 1, the input wave is a high-frequency wave.

The input wave is input to the control signal generation unit 600.

The control signal generation unit 600 modulates the high-frequency wave in accordance with the input signal to thereby generate a control signal.

The control signal generated by the control signal generation unit 600 includes a first control signal and a second control signal.

It should be noted that the input signal may be input from outside of the signal generation device 1600. The input signal may be generated by a means for generating the input signal (for example, an input-signal generation unit 50 described hereinafter, or the like). At such time, the signal generation device 1600 itself may include the means for generating the input signal.

The drive signal generated by the insulation unit 700 includes a first drive signal and a second drive signal.

The insulation unit 700 includes a second insulation element 710, a third insulation element 720, a second rectification unit 730, and a third rectification unit 740.

The second insulation element 710 isolatedly transmits the first control signal. The second insulation element 710 includes a transmission unit 711 (e.g., transmission portion) and a reception unit 712 (e.g., reception portion). The second insulation element 710 isolatedly transmits the first control signal that is input to the transmission unit 711, to thereby output an isolatedly transmitted first control signal from the reception unit 712.

The second rectification unit 730 rectifies the isolatedly transmitted first control signal to thereby generate the first drive signal.

The third insulation element 720 isolatedly transmits the second control signal. The third insulation element 720 includes a transmission unit 721 (e.g., transmission portion) and a reception unit 722 (e.g., reception portion). The third insulation element 720 isolatedly transmits the second control signal that is input to the transmission unit 721, to thereby output an isolatedly transmitted second control signal from the reception unit 722.

The third rectification unit 740 rectifies the isolatedly transmitted second control signal to thereby generate the second drive signal.

A configuration depicted in FIG. 8 described hereinafter, for example, is used as the second insulation element 710, the third insulation element 720, the second rectification unit 730, and the third rectification unit 740.

It should be noted that the second insulation element 710 and the third insulation element 720 may be insulation elements having the same configuration as the aforementioned first insulation element 100. Alternatively, the first insulation element 100, the second insulation element 710, and the third insulation element 720 may be insulation elements having configurations that are different from each other.

The output selection unit 300 includes the first switching element 310 and the second switching element 320.

The on/off state of the first switching element 310 is switched by the first drive signal.

The on/off state of the second switching element 320 is switched by the second drive signal.

The conducting/non-conducting state between the power source unit 200 and the output terminal 10 changes according to the on/off states of the first switching element 310 and the second switching element 320. Whether or not the output signal is output from the output terminal 10 is thereby selected.

When the power source unit 200 and the output terminal 10 are in the conducting state, the output signal is output from the output terminal 10.

As depicted in FIG. 7, the signal generation device 1600 includes, on the primary side thereof (the transmission side for insulation and transmission), the control signal generation unit 600, the transmission unit 711, and the transmission unit 721.

Furthermore, as depicted in FIG. 7, the signal generation device 1600 includes, on the secondary side thereof (the reception side for insulation and transmission), the reception unit 712, the reception unit 722, the second rectification unit 730, and the third rectification unit 740.

Figure 8:
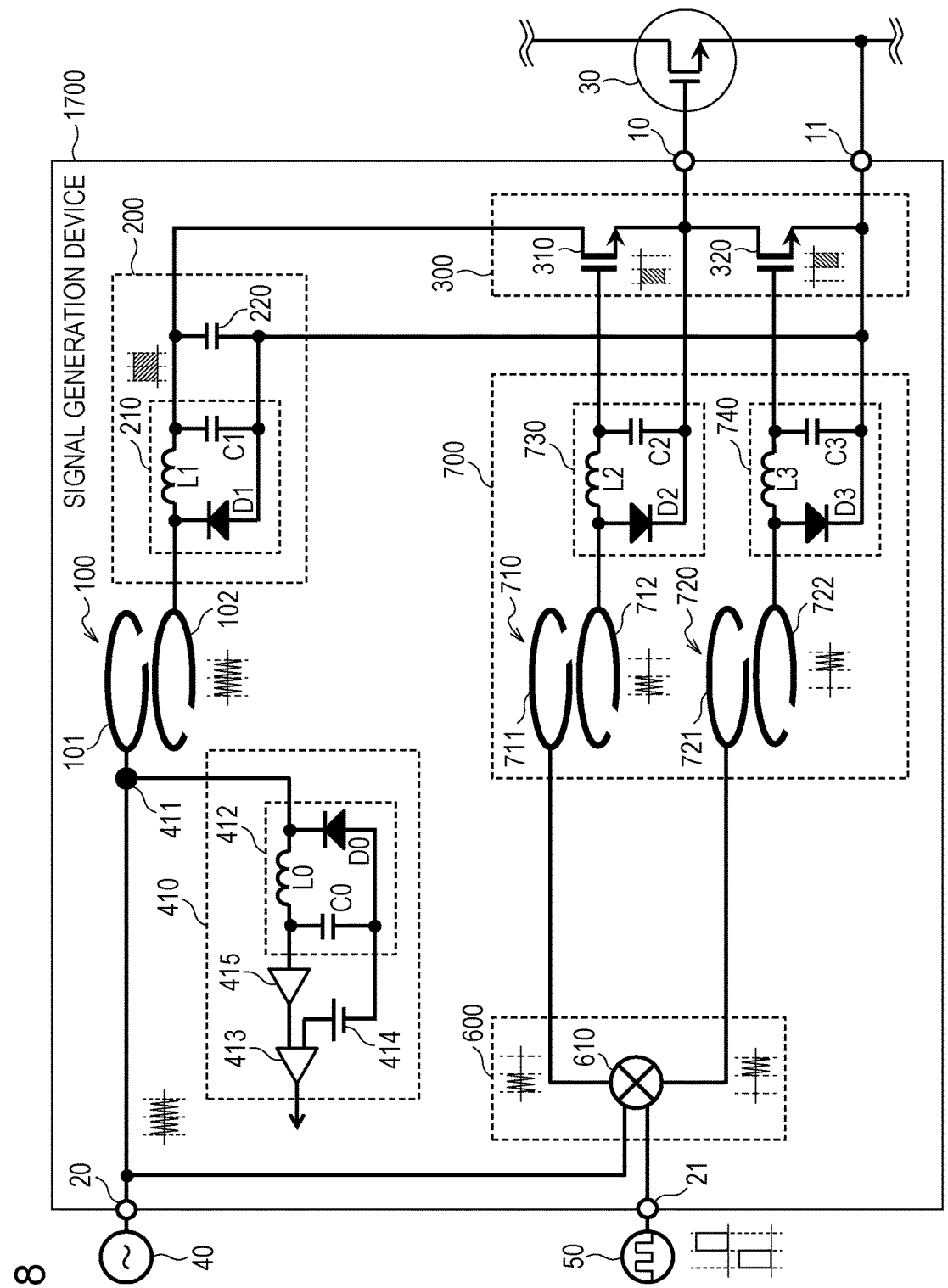
FIG. 8 is a drawing depicting a schematic configuration of a signal generation device in embodiment 1.

FIG. 8 is a drawing depicting a schematic configuration of a signal generation device 1700 in embodiment 1.

Hereinafter, with regard to FIG. 8, explanations of portions that are common to the aforementioned FIG. 5 are omitted as appropriate.

In addition to the aforementioned configuration of the signal generation device 1600, the signal generation device 1700 in embodiment 1 is also provided with the configuration described hereinafter.

More specifically, in the signal generation device 1700 in embodiment 1, the control signal generation unit 600 includes a modulation unit 610.

In the configuration example depicted in FIG. 8, the signal generation device 1700 is also provided with an input-signal input terminal 21.

The input-signal input terminal 21 and the input-wave input terminal 20 are connected to the modulation unit 610.

The input-signal input terminal 21 is connected to the input-signal generation unit 50.

The input-signal generation unit 50 generates a first input signal and a second input signal as input signals.

The first input signal and the second input signal are input to the input-signal input terminal 21 as input signals.

The modulation unit 610 modulates a high-frequency wave in accordance with the first input signal to thereby generate the first control signal. Furthermore, the modulation unit 610 modulates a high-frequency wave in accordance with the second input signal to thereby generate the second control signal.

The second insulation element 710 is an electromagnetic resonance coupler. The electromagnetic resonance coupler includes a transmission-side wiring (the transmission unit 711) and a reception-side wiring (the reception unit 712). The reception-side wiring opposes the transmission-side wiring.

The third insulation element 720 is an electromagnetic resonance coupler. The electromagnetic resonance coupler includes a transmission-side wiring (the transmission unit 721) and a reception-side wiring (the reception unit 722). The reception-side wiring opposes the transmission-side wiring.

The second rectification unit 730 is a rectifier circuit made up of a reactor L2, a diode D2, and a capacitor C2.

An input end of the second rectification unit 730 is connected to the reception-side wiring (the reception unit 712 of the second insulation element 710) of the electromagnetic resonance coupler.

One output end of the second rectification unit 730 is connected to the conduction control terminal (for example, the gate terminal) of the first switching element 310.

Another output end of the second rectification unit 730 is connected to a path that joins the second terminal (for example, the source terminal) of the first switching element 310 and the first terminal (for example, the drain terminal) of the second switching element 320.

The third rectification unit 740 is a rectifier circuit made up of a reactor L3, a diode D3, and a capacitor C3.

An input end of the third rectification unit 740 is connected to the reception-side wiring (the reception unit 722 of the third insulation element 720) of the electromagnetic resonance coupler.

One output end of the third rectification unit 740 is connected to the conduction control terminal (for example, the gate terminal) of the second switching element 320.

Another output end of the third rectification unit 740 is connected to the second terminal (for example, the source terminal) of the second switching element 320.

[Method for Generating Output Signal]

Hereinafter, an example of a method for generating an output signal (operation of the signal generation device) will be described.

The first input signal and the second input signal, as indicated in FIG. 8, may be pulse signals having a mutually complementary relationship (for example, in a period in which the amplitude of one signal is large, the amplitude of the other signal is small).

In this case, the first control signal and the second control signal have a mutually complementary relationship, as indicated in FIG. 8. Therefore, the first drive signal and the second drive signal have a mutually complementary relationship, as indicated in FIG. 8.

At such time, the first switching element 310 and the second switching element 320 are subjected to switching control with which one enters an off state in a period in which the other is in an on state.

The first input signal and the second input signal having a mutually complementary relationship are repeatedly input over a predetermined operation period, and the switching control is thereby executed over the predetermined operation period. It should be noted that the frequency of this switching control can be adjusted by adjusting the frequency of switching the first input signal and the second input signal.

Furthermore, input waves are input to the first insulation element 100 over the aforementioned predetermined operation period. Therefore, a charging voltage is generated by the first rectification unit 210 over the aforementioned predetermined operation period.

In a period in which the first switching element 310 is in an off state and the second switching element 320 is in an on state, the charge accumulation element 220 is charged by charging voltage generated by the first rectification unit 210.

Thereafter, upon transitioning to a period in which the first switching element 310 is in an on state and the second switching element 320 is in an off state, the charge accumulated in the charge accumulation element 220 is output, via the first switching element 310, from the output terminal 10 as a portion of an output signal. A large current can thereby be momentarily output from the output terminal 10.

Thereafter, upon transitioning to a period in which the first switching element 310 is in an off state and the second switching element 320 is in an on state once again, the charge accumulated in the conduction control terminal (for example, the gate terminal) of the switching element 30 is discharged, via the second switching element 320, to the output reference terminal 11. It is thereby possible to increase the speed at which the switching element 30 is stopped.

By repeating the aforementioned output operation, for example, the switching element 30 is able to perform switching quickly.

[Detection Signal Measurement Test]

Figure 9:
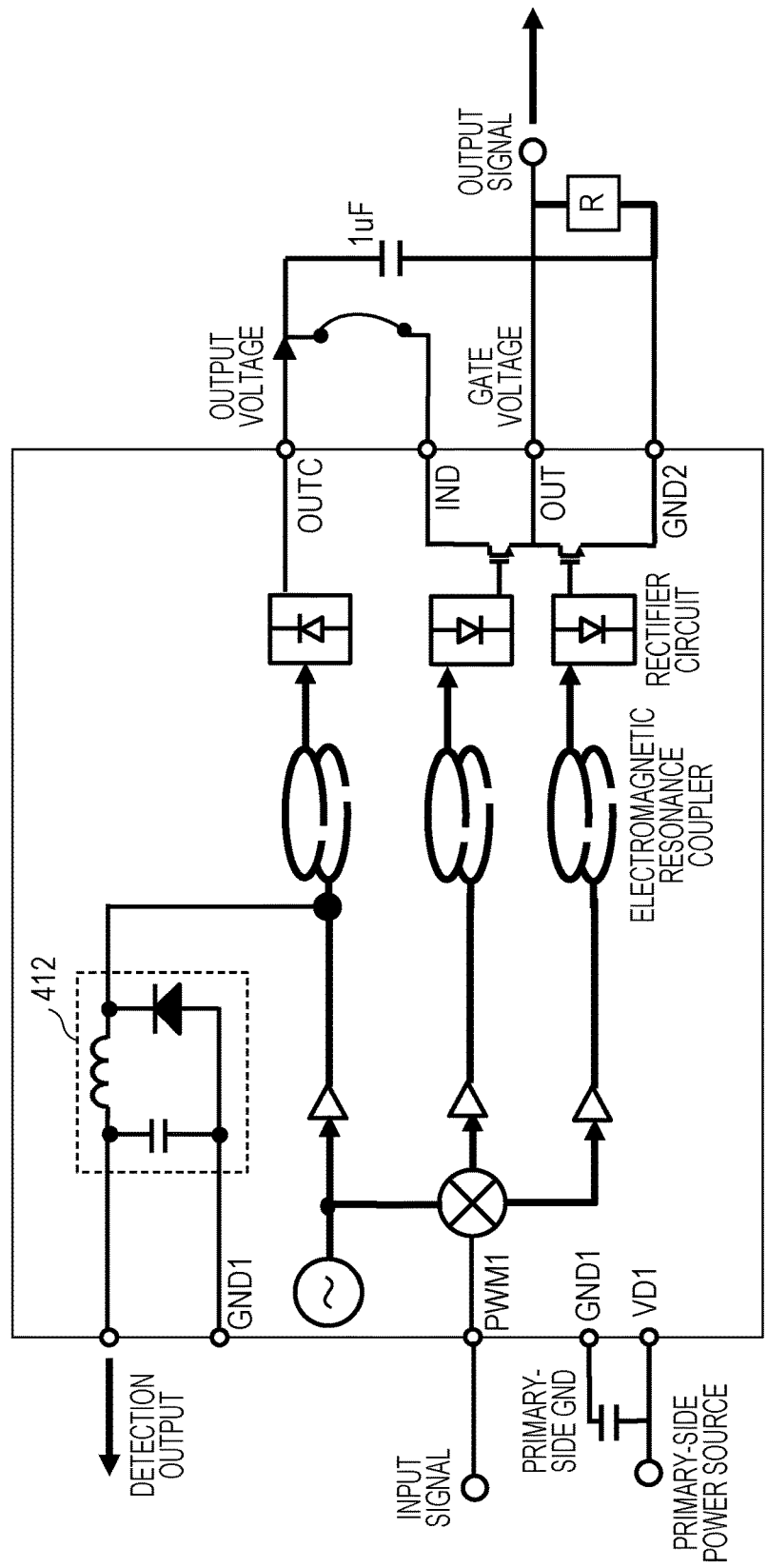
FIG. 9 is a drawing depicting a circuit used in a detection signal measurement test.

FIG. 9 is a drawing depicting a circuit used in a detection signal measurement test.

The circuit configuration depicted in FIG. 9 is based upon the aforementioned configuration of the signal generation device 1700 depicted in FIG. 8. Furthermore, the method for generating a gate voltage in the present measurement test is based upon the aforementioned method for generating an output signal.

The detection signal was measured with the load indicated by "R" in FIG. 9 being 10Ω, 100Ω, and 1000Ω, and with the portion indicated by "R" having been disconnected.

FIGS. 10A to 10D are drawings depicting detection signal measurement results.

Figure 10B:
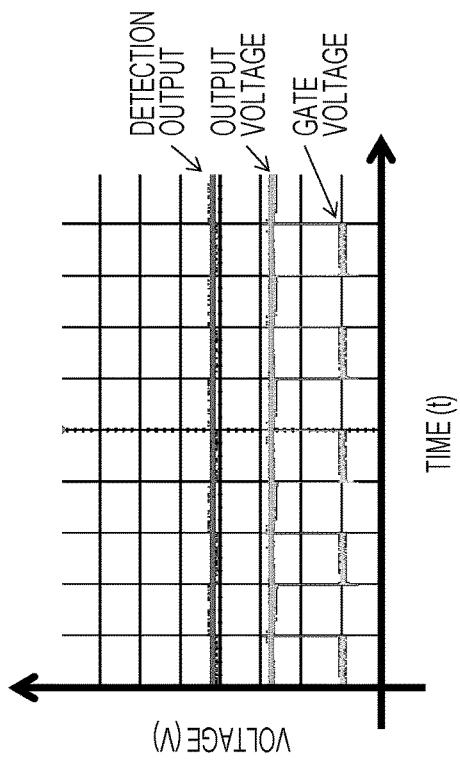
FIGS. 10A to 10D are drawings depicting detection signal measurement results.
Figure 10D:
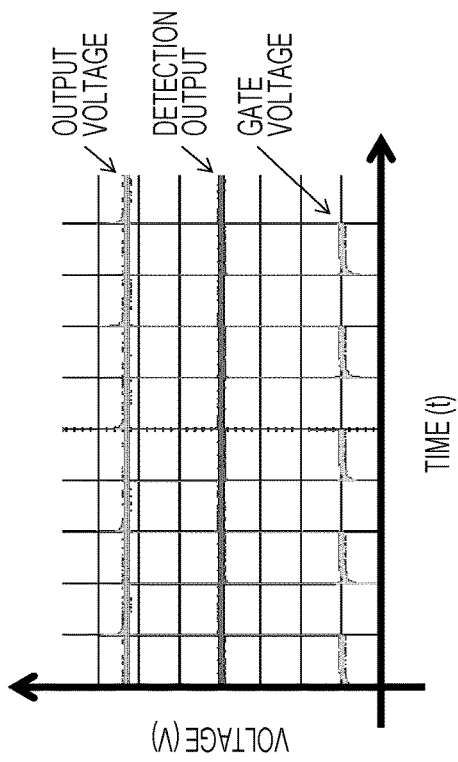
Figure 10A:
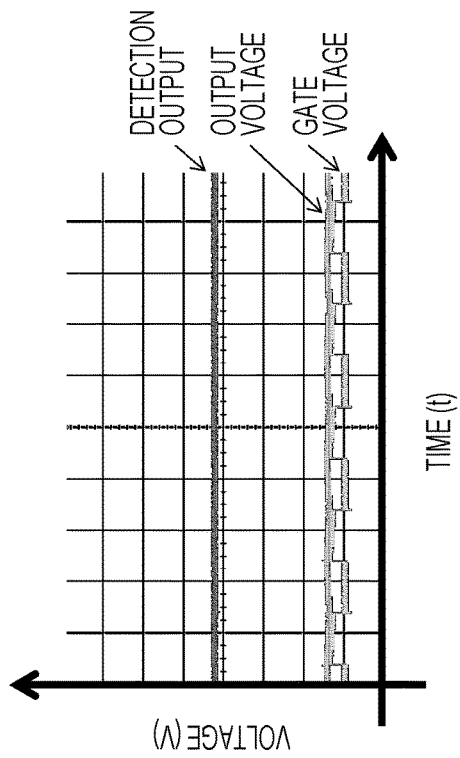

FIG. 10A is a drawing depicting detection signal measurement results with the load "R" being 10Ω. The voltage value of the detection output constituting the detection signal in the case depicted in FIG. 10A is 3.177 V.

FIG. 10B is a drawing depicting detection signal measurement results with the load "R" being 100Ω. The voltage value of the detection output constituting the detection signal in the case depicted in FIG. 10B is 3.09 V.

Figure 10C:
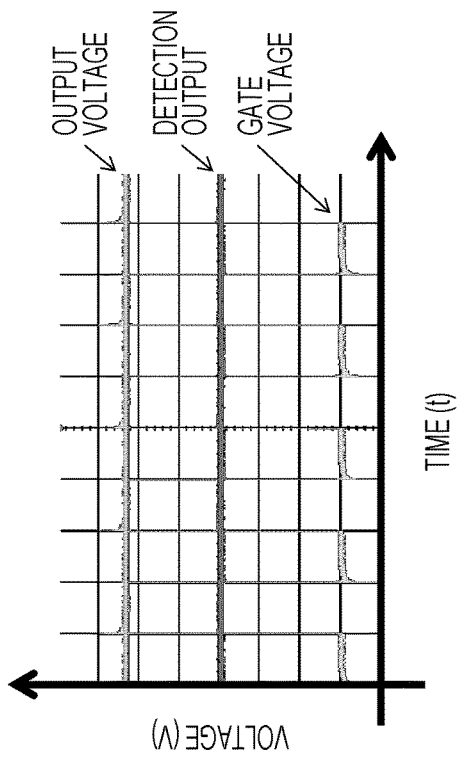

FIG. 10C is a drawing depicting detection signal measurement results with the load "R" being 1000Ω. The voltage value of the detection output constituting the detection signal in the case depicted in FIG. 10C is 3.025 V.

FIG. 10D is a drawing depicting detection signal measurement results with the load "R" portion having been disconnected. The voltage value of the detection output constituting the detection signal in the case depicted in FIG. 10D is 3.023 V.

As mentioned above, the detection signal changes in response to changes in the output signal. Consequently, on the primary side (the transmission side for insulation and transmission) of the circuitry of the signal generation device, it is possible to detect a change in the output signal (for example, the occurrence of an abnormality such as a low voltage state, or the like) on the secondary side (the reception side for insulation and transmission).

(Embodiment 2)

Hereinafter, embodiment 2 will be described. Explanations that overlap with the aforementioned embodiment 1 are omitted as appropriate.

Figure 11:
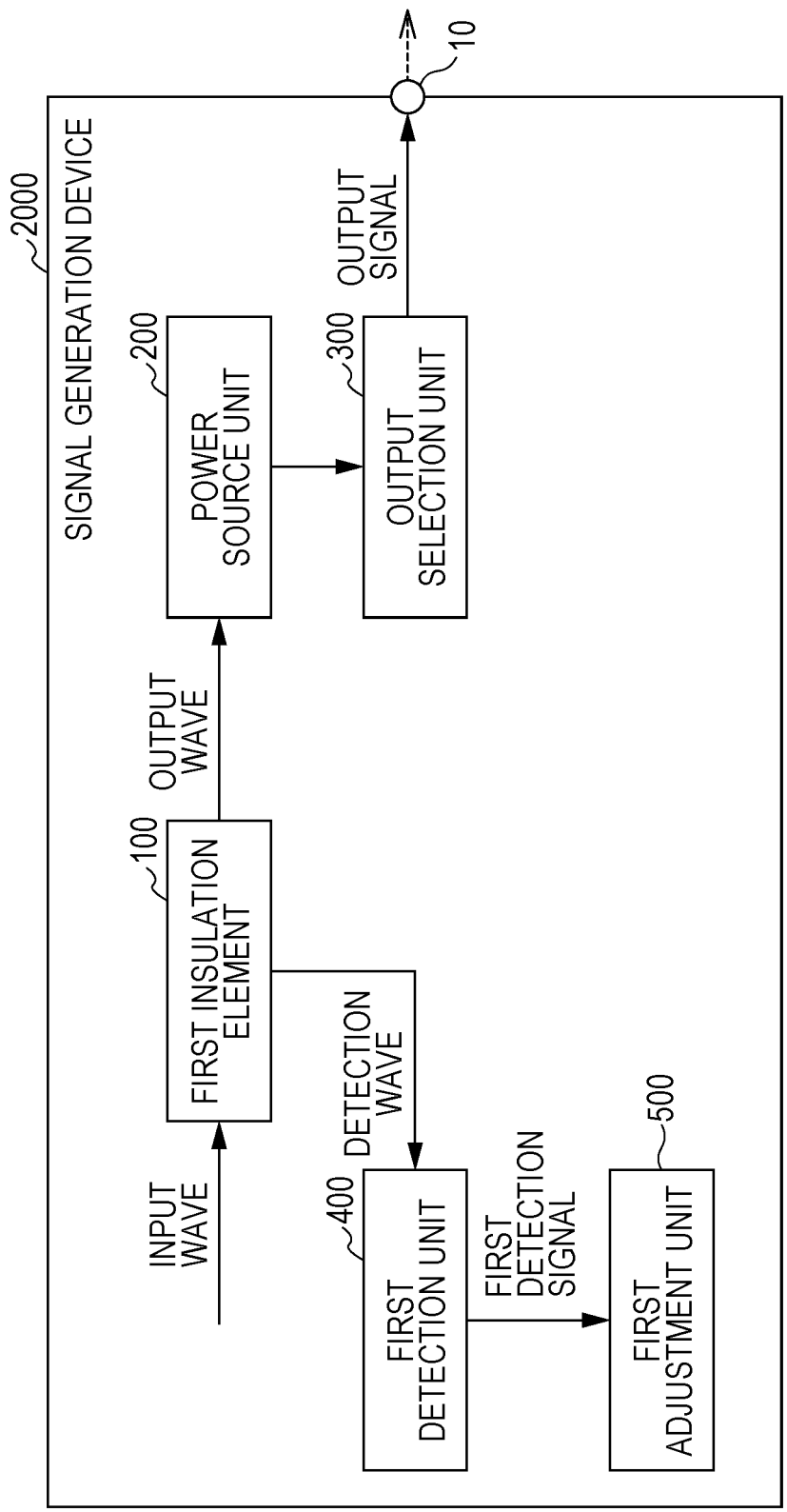
FIG. 11 is a drawing depicting a schematic configuration of a signal generation device in embodiment 2.

FIG. 11 is a drawing depicting a schematic configuration of a signal generation device 2000 in embodiment 2.

In addition to the aforementioned configuration of the signal generation device 1000 in embodiment 1, the signal generation device 2000 in embodiment 2 is also provided with the configuration described hereinafter.

More specifically, the signal generation device 2000 in embodiment 2 includes a first adjustment unit 500.

The first adjustment unit 500 adjusts an output signal on the basis of a first detection signal generated by the first detection unit 400.

According to the aforementioned configuration, changes in the output signal can be adjusted in an efficient manner. For example, an abnormality in the output signal can be eliminated in an efficient manner.

A configuration depicted in FIGS. 12 to 16 described hereinafter, for example, is used as the first adjustment unit 500.

It should be noted that the first adjustment unit 500 may include a control circuit for adjusting the output signal on the basis of the first detection signal.

Furthermore, the signal generation device 2000 may include, on the primary side thereof (the transmission side for insulation and transmission), the first adjustment unit 500.

Figure 12:
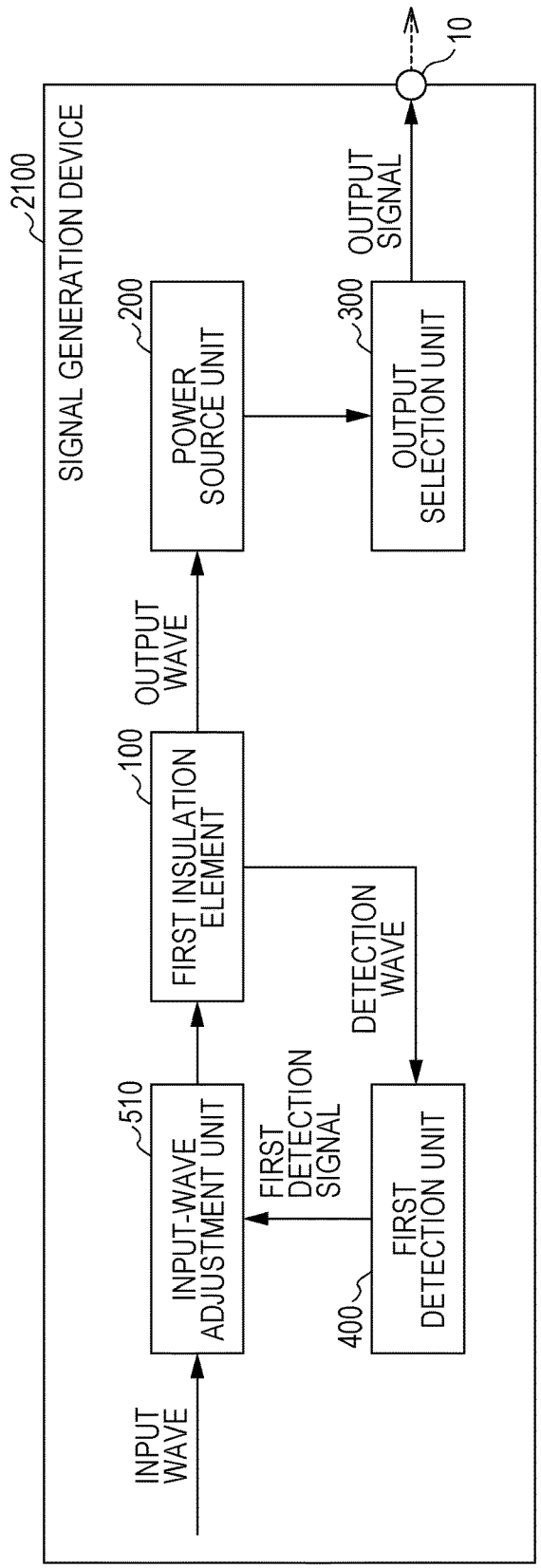
FIG. 12 is a drawing depicting a schematic configuration of a signal generation device in embodiment 2.

FIG. 12 is a drawing depicting a schematic configuration of a signal generation device 2100 in embodiment 2.

In addition to the aforementioned configuration of the signal generation device 2000, the signal generation device 2100 in embodiment 2 is also provided with the configuration described hereinafter.

More specifically, in the signal generation device 2100 in embodiment 2, the first adjustment unit 500 includes an input-wave adjustment unit 510.

The first detection signal is input to the input-wave adjustment unit 510.

The input-wave adjustment unit 510 performs an adjustment of the input wave in accordance with the first detection signal.

The output signal is adjusted in accordance with the adjustment of the input wave by the input-wave adjustment unit 510.

According to the aforementioned configuration, it is possible to adjust, in an efficient manner, the characteristics (for example, the amplitude, frequency, or the like) of the input wave isolatedly transmitted by the first insulation element, in accordance with the state of the transmission unit of the first insulation element. It is thereby possible for the size of the power source voltage generated by the power source unit to be adjusted in an efficient manner, for example. As a result, changes in the output signal can be adjusted in a more efficient manner, for example. For instance, an abnormality in the output signal can be eliminated in a more efficient manner.

It should be noted that, in the signal generation device 2100 in embodiment 2, when the output signal is equal to or less than a predetermined voltage value, the first detection unit 400 may generate a first abnormality signal as the first detection signal.

The input-wave adjustment unit 510 may amplify (i.e., perform an amplification of) the input wave when the first abnormality signal has been input.

At such time, the output signal may become higher than the predetermined voltage value in accordance with the amplification of the input wave by the input-wave adjustment unit 510.

According to the aforementioned configuration, when the output signal has entered a low-voltage state, it is possible to amplify, in an efficient manner, the input wave isolatedly transmitted by the first insulation element. It is thereby possible to further increase, in an efficient manner, the power source voltage generated by the power source unit, for example. As a result, a low-voltage state of the output signal can be eliminated in an efficient manner, for example.

A configuration depicted in FIG. 13 described hereinafter, for example, is used as the input-wave adjustment unit 510.

Figure 13:
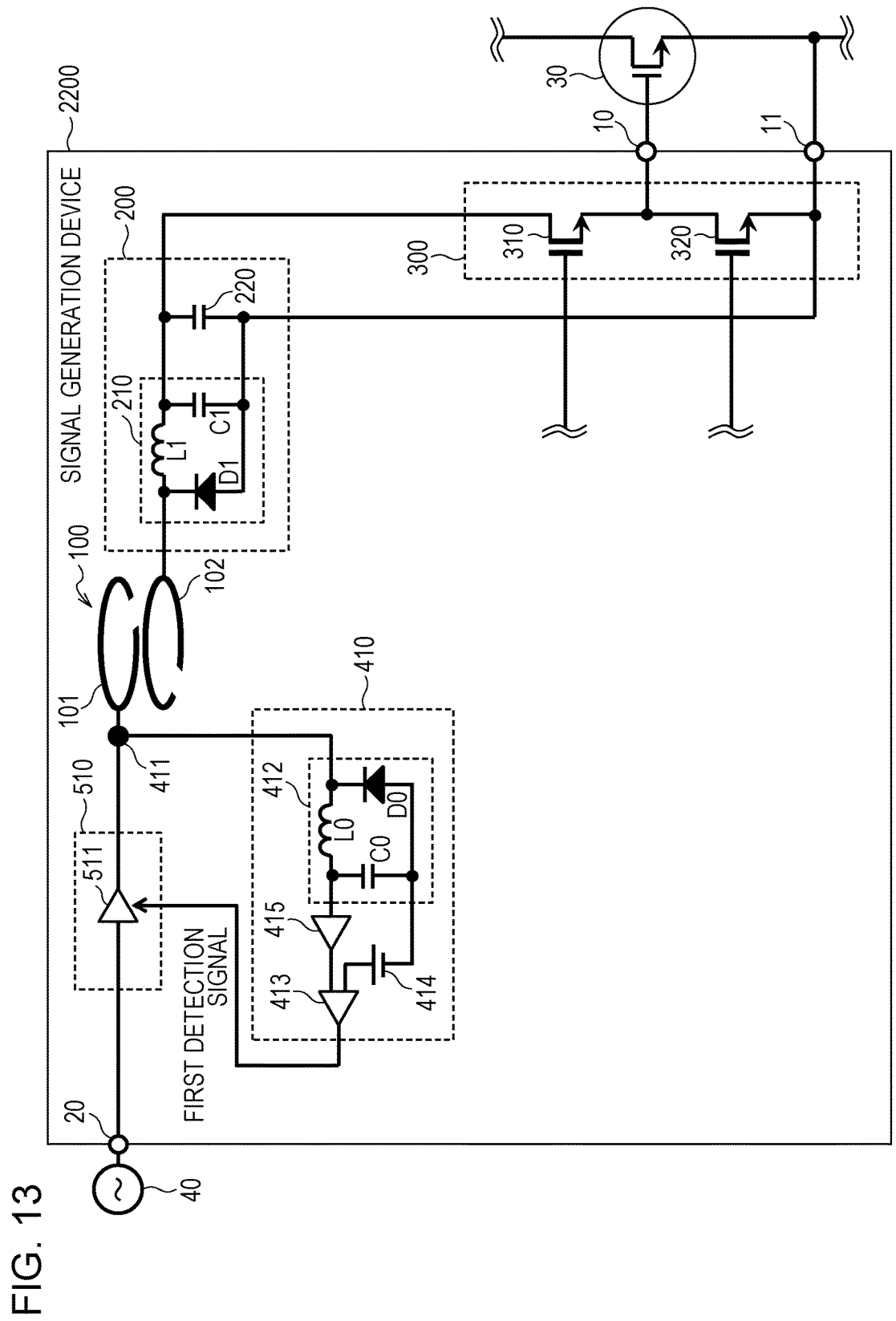
FIG. 13 is a drawing depicting a schematic configuration of a signal generation device in embodiment 2.

FIG. 13 is a drawing depicting a schematic configuration of a signal generation device 2200 in embodiment 2.

In the signal generation device 2200 in embodiment 2, the input-wave adjustment unit 510 includes an amplifier 511.

The amplifier 511 amplifies an input wave in accordance with the first detection signal generated by the first detection circuit 410.

It should be noted that the input-wave adjustment unit 510 may also include a control circuit for controlling the amplifier 511.

Figure 14:
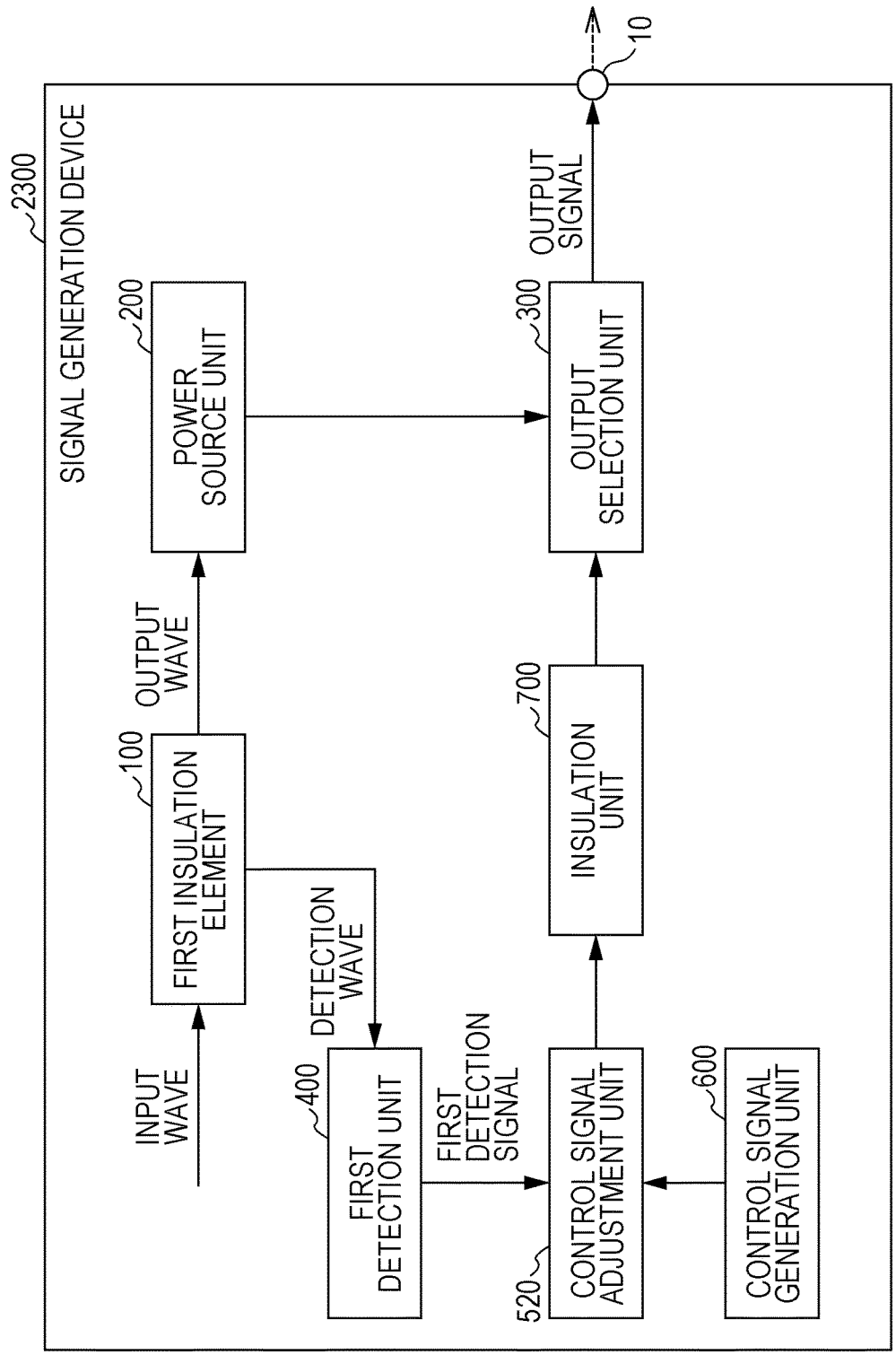
FIG. 14 is a drawing depicting a schematic configuration of a signal generation device in embodiment 2.

FIG. 14 is a drawing depicting a schematic configuration of a signal generation device 2300 in embodiment 2.

In addition to the aforementioned configuration of the signal generation device 2000, the signal generation device 2300 in embodiment 2 is also provided with the configuration described hereinafter.

More specifically, the signal generation device 2300 in embodiment 2 includes the control signal generation unit 600 and the insulation unit 700.

The control signal generation unit 600 generates a control signal.

The first adjustment unit 500 includes a control signal adjustment unit 520.

The control signal adjustment unit 520 adjusts the control signal in accordance with the first detection signal.

The insulation unit 700 isolatedly transmits the adjusted control signal, and generates a drive signal on the basis of the isolatedly transmitted control signal.

The output selection unit 300 selects whether or not the output signal is to be output to the output terminal 10, on the basis of the drive signal.

According to the aforementioned configuration, it is possible to adjust, in an efficient manner, the characteristics (for example, the amplitude, frequency, or the like) of the control signal isolatedly transmitted by the insulation unit, in accordance with the state of the transmission unit of the first insulation element. Thus, the operation of the output selection unit can be adjusted in an efficient manner, for example. As a result, changes in the output signal can be adjusted in a more efficient manner, for example. For instance, an abnormality in the output signal can be eliminated in a more efficient manner.

It should be noted that, in the signal generation device 2300 in embodiment 2, when the output signal is equal to or less than a predetermined voltage value, the first detection unit 400 may generate a first abnormality signal as the first detection signal.

The control signal adjustment unit 520 may attenuate (i.e., perform an attenuation of) the control signal upon the first abnormality signal being input.

An attenuation of the drive signal may be occurred in accordance with the attenuation of the control signal.

The outputting of the output signal to the output terminal 10 by the output selection unit 300 may be stopped in accordance with the attenuation of the drive signal.

According to the aforementioned configuration, it is possible for the control signal isolatedly transmitted by the insulation unit to be attenuated (for example, stopped) in an efficient manner in accordance with the state of the transmission unit of the first insulation element. Thus, the operation of the output selection unit can be stopped in an efficient manner, for example. As a result, for example, when an abnormality has occurred in the output signal (for example, when the output signal has entered a state a low-voltage state), the outputting of the output signal can be stopped in an efficient manner.

A configuration depicted in FIG. 15 or 16 described hereinafter, for example, is used as the control signal adjustment unit 520.

Figure 15:
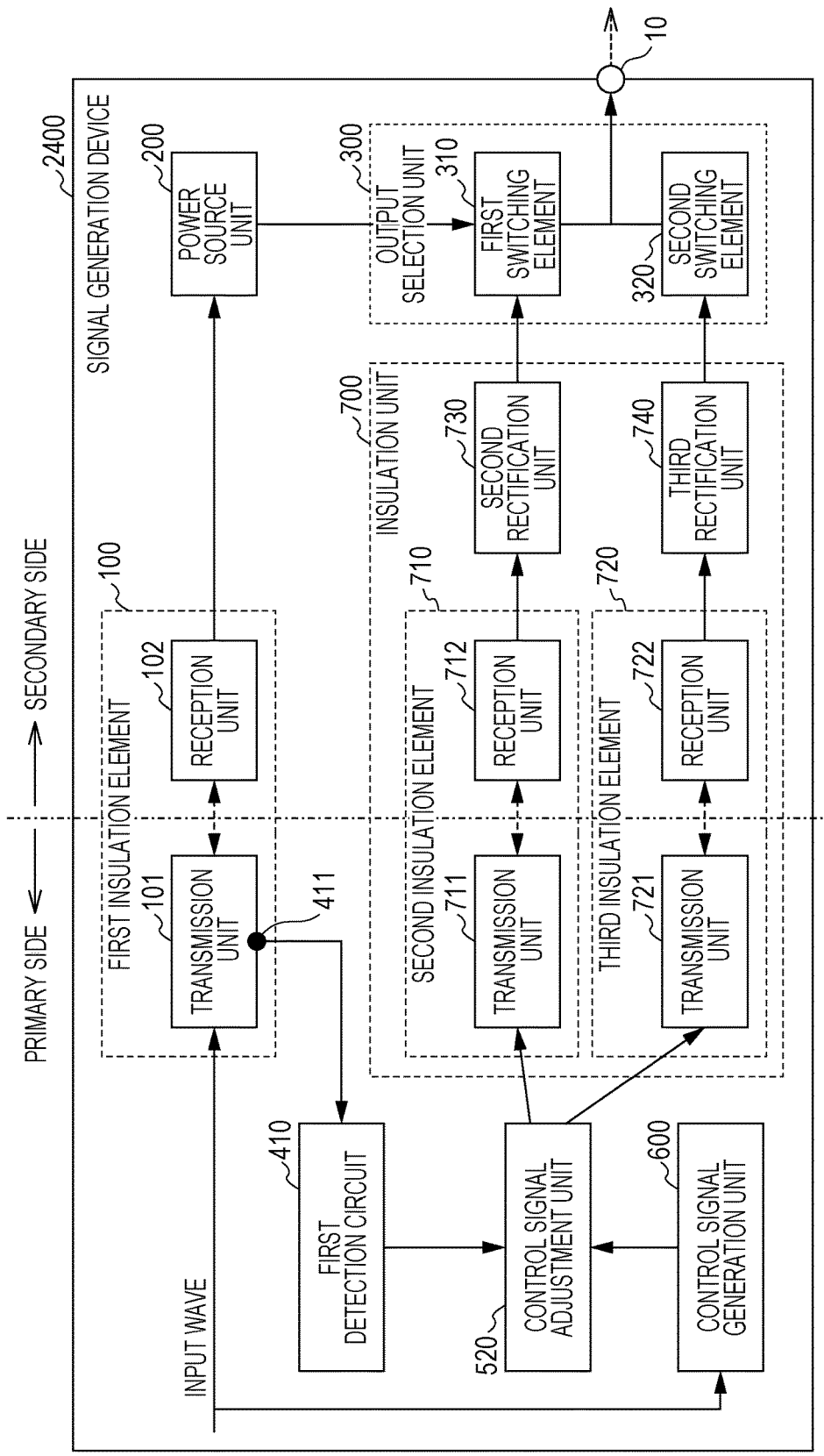
FIG. 15 is a drawing depicting a schematic configuration of a signal generation device in embodiment 2.

FIG. 15 is a drawing depicting a schematic configuration of a signal generation device 2400 in embodiment 2.

In addition to the aforementioned configuration of the signal generation device 2300, the signal generation device 2400 in embodiment 2 is also provided with the configuration described hereinafter.

More specifically, in the signal generation device 2400 in embodiment 2, the input wave is input to the control signal generation unit 600. At such time, the input wave is a high-frequency wave.

The control signal generation unit 600 modulates the high-frequency wave in accordance with the input signal to thereby generate a first control signal and a second control signal. In other words, the control signal includes the first control signal and the second control signal.

The drive signal includes a first drive signal and a second drive signal.

The insulation unit 700 includes the second insulation element 710, the third insulation element 720, the second rectification unit 730, and the third rectification unit 740.

The second insulation element 710 isolatedly transmits the first control signal.

The second rectification unit 730 rectifies the isolatedly transmitted first control signal to thereby generate the first drive signal.

The third insulation element 720 isolatedly transmits the second control signal.

The third rectification unit 740 rectifies the isolatedly transmitted second control signal to thereby generate the second drive signal.

The output selection unit 300 includes the first switching element 310 and the second switching element 320.

The on/off state of the first switching element 310 is switched by the first drive signal.

The on/off state of the second switching element 320 is switched by the second drive signal.

The conducting/non-conducting state between the power source unit 200 and the output terminal 10 changes according to the on/off states of the first switching element 310 and the second switching element 320. Whether or not the output signal is output from the output terminal 10 is thereby selected.

When the power source unit 200 and the output terminal 10 are in the conducting state, the output signal is output from the output terminal 10.

The control signal adjustment unit 520 adjusts (for example, attenuates) at least one of the first control signal and the second control signal upon the first abnormality signal being input.

According to the aforementioned configuration, it is possible to adjust, in a more efficient manner, the characteristics (for example, the amplitude, frequency, or the like) of the control signal isolatedly transmitted by the insulation unit, in accordance with the state of the transmission unit of the first insulation element. Thus, the operation of the output selection unit can be adjusted in a more efficient manner, for example. As a result, changes in the output signal can be adjusted in a more efficient manner, for example. For instance, an abnormality in the output signal can be eliminated in a more efficient manner.

Figure 16:
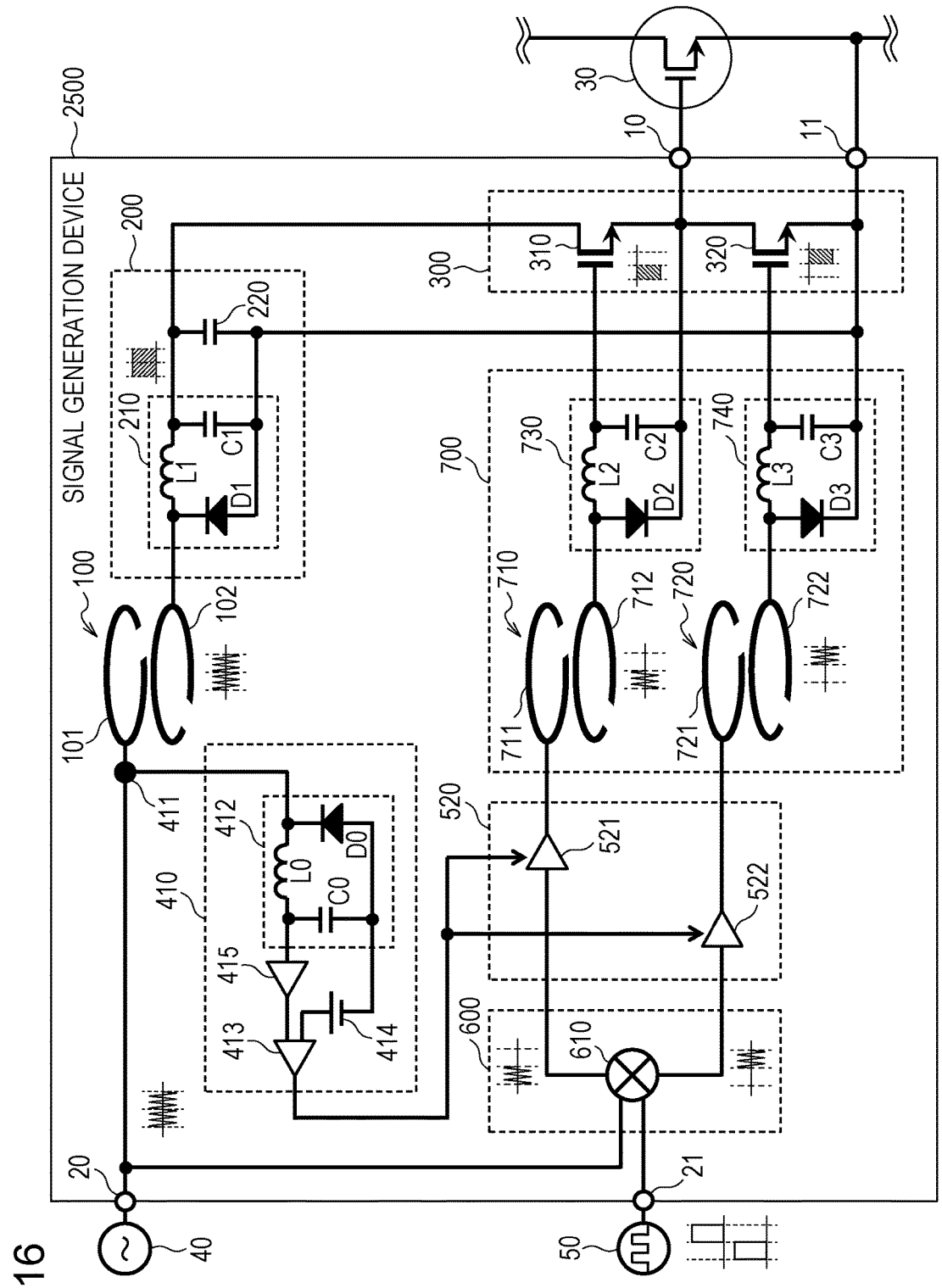
FIG. 16 is a drawing depicting a schematic configuration of a signal generation device in embodiment 2.

FIG. 16 is a drawing depicting a schematic configuration of a signal generation device 2500 in embodiment 2.

In the signal generation device 2500 in embodiment 2, the control signal adjustment unit 520 includes an amplifier 521 and an amplifier 522.

The amplifier 521 attenuates the first control signal in accordance with the first detection signal generated by the first detection circuit 410.

The amplifier 522 attenuates the second control signal in accordance with the first detection signal generated by the first detection circuit 410.

It should be noted that the control signal adjustment unit 520 may also include a control circuit for controlling the amplifier 521 and the amplifier 522.

It should be noted that the control signal adjustment unit 520 may be a configuration provided with only either one of the amplifier 521 and the amplifier 522.

It should be noted that the signal generation device in embodiment 2 may be a configuration provided with both of the aforementioned input-wave adjustment unit 510 and control signal adjustment unit 520, as the first adjustment unit 500.

According to the aforementioned configuration, it is possible to also efficiently adjust the characteristics (for example, the amplitude, frequency, or the like) of the control signal isolatedly transmitted by the insulation unit, while efficiently adjusting the characteristics (for example, the amplitude, frequency, or the like) of the input wave, in accordance with the state of the transmission unit of the first insulation element.

It should be noted that fluctuations caused by temperature characteristics may occur in the input waves or the output signal due to changes in the temperature of the circuitry of the signal generation device. Such fluctuations caused by temperature characteristics can also be detected as fluctuations in the first detection signal. Therefore, the signal generation device of embodiment 2 may include, as the first adjustment unit 500, an adjustment unit that implements an adjustment in such a way that fluctuations caused by temperature characteristics are suppressed, on the basis of the first detection signal. Fluctuations caused by temperature characteristics can thereby be suppressed.

(Embodiment 3)

Hereinafter, embodiment 3 will be described. Explanations that overlap with the aforementioned embodiment 1 or embodiment 2 are omitted as appropriate.

Figure 17:
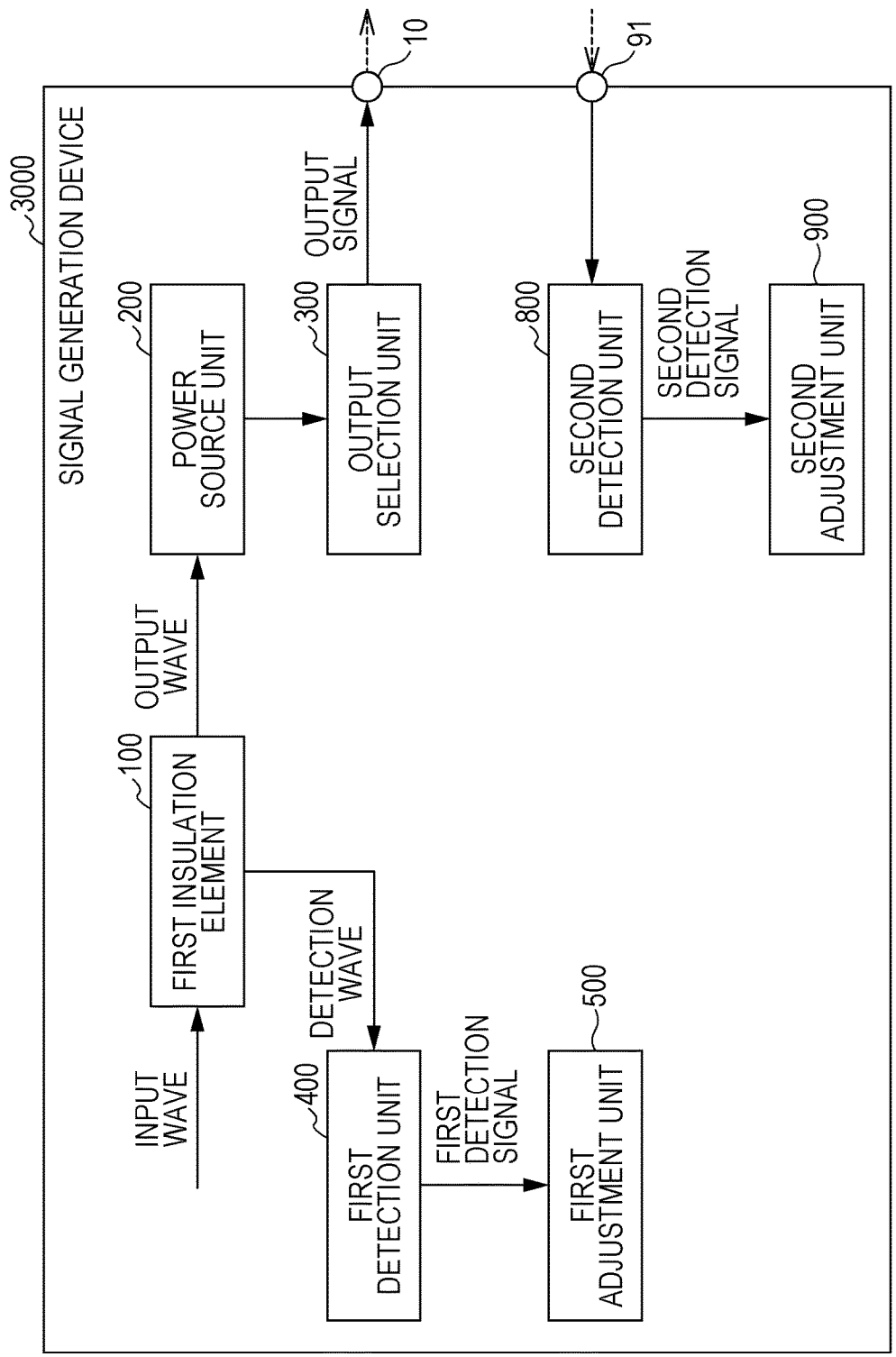
FIG. 17 is a drawing depicting a schematic configuration of a signal generation device in embodiment 3.

FIG. 17 is a drawing depicting a schematic configuration of a signal generation device 3000 in embodiment 3.

In addition to the aforementioned configuration of the signal generation device 2000 in embodiment 2, the signal generation device 3000 in embodiment 3 is also provided with the configuration described hereinafter.

More specifically, the signal generation device 3000 in embodiment 3 includes a second detection unit 800, a second adjustment unit 900, and the secondary-side input terminal 91.

A signal, which is obtained from an external circuit to which the output signal is input, is input to the secondary-side input terminal 91.

The second detection unit 800 detects the signal from the secondary-side input terminal 91. The second detection unit 800 generates a second detection signal corresponding to the output signal, on the basis of the signal from the secondary-side input terminal 91.

The second adjustment unit 900 adjusts the output signal on the basis of the second detection signal.

According to the aforementioned configuration, it is possible for an abnormality in the output signal to be detected and adjusted on the basis of the first detection signal of the first detection unit, and an abnormality in the output signal to be detected and adjusted on the basis of the second detection signal of the second detection unit, at the same time. As a result, changes in the output signal can be adjusted in a more efficient manner, for example. For instance, an abnormality in the output signal can be eliminated in a more efficient manner.

It should be noted that, in the signal generation device 3000 in embodiment 3, when the output signal is equal to or less than a predetermined voltage value, the second detection unit 800 may generate a second abnormality signal as the second detection signal.

At such time, when the second abnormality signal has been input, the second adjustment unit 900 may stop the outputting of the output signal to the output terminal.

According to the aforementioned configuration, it is possible for an abnormality in the output signal to be detected and adjusted on the basis of the first detection signal of the first detection unit, and outputting of the output signal to be stopped on the basis of the second detection signal of the second detection unit, at the same time. As a result, for example, outputting of the output signal can be stopped while an abnormality in the output signal is notified to outside of the signal generation device on the basis of the first detection signal of the first detection unit. Thus, a more stable operation of the signal generation device can be realized.

It should be noted that the second adjustment unit 900 may adjust the output signal by controlling the output selection unit 300 on the basis of the second detection signal.

Furthermore, the second adjustment unit 900 may include a control circuit for adjusting the output signal on the basis of the second detection signal.

Furthermore, the signal generation device 3000 may include, on the primary side thereof (the transmission side for insulation and transmission), the first detection unit 400 and the first adjustment unit 500.

Furthermore, the signal generation device 3000 may include, on the secondary side thereof (the reception side for insulation and transmission), the second detection unit 800 and the second adjustment unit 900.

It should be noted that the control circuit which may be provided in the first adjustment unit 500 or the second adjustment unit 900 may be configured by means of a processor (for example, a central processing unit (CPU), a micro-processing unit (MPU), or the like) and a memory, for example. At such time, the processor may execute the control method (adjustment method) given in the present disclosure by reading and executing a program stored in the memory.

It should be noted that, in the aforementioned embodiments 1 to 3, "connection between two elements" (for example, an element being connected to another element) may mean not only a direct connection but also an electrical connection or a connection in which another element (for example, a wire, a resistance element, or the like that does not impair the function of the embodiment) is provided between the two elements.

The present disclosure is useful as a gate drive circuit for driving a power semiconductor device that handles a high power, for example.

What is claimed is:

1. A signal generation device, comprising:
   a first insulation element including a transmission unit and a reception unit, the first insulation element configured to isolatedly transmit an input wave that is input to the transmission unit, to thereby output an output wave from the reception unit;
   a power source unit, connected to the first insulation element, configured to generate a power source voltage based on the output wave received from the reception unit;
   a control signal generation unit configured to generate a control signal;
   an insulation unit, connected to the control signal generation unit, configured to isolatedly transmit the control signal, and to generate a drive signal based on the isolatedly transmitted control signal;
   an output selection unit configured to select whether or not an output signal is to be output to an output terminal based on the drive signal, the output terminal is connected to the output selection unit and is a terminal to which the output signal, having a voltage corresponding to the power source voltage, is output;
   a first detection unit, connected to the first insulation element, configured to generate a first detection signal indicating a state of the output signal based on a detection wave received from the transmission unit; and
   a control signal adjustment unit, connected to the first detection unit, configured to perform an adjustment of the control signal in accordance with the first detection signal,
   wherein the output signal is adjusted in accordance with the adjustment of the control signal by the control signal adjustment unit.

2. The signal generation device according to claim 1,
   wherein, when the output signal is equal to or less than a predetermined voltage value, the first detection unit is configured to generate a first abnormality signal as the first detection signal,
   the control signal adjustment unit is configured to perform an attenuation of the control signal upon the first abnormality signal being input,
   an attenuation of the drive signal is occurred in accordance with the attenuation of the control signal, and
   outputting of the output signal to the output terminal by the output selection unit is stopped in accordance with the attenuation of the drive signal.

3. The signal generation device according to claim 1,
   wherein the input wave is input to the control signal generation unit,
   the input wave is a high-frequency wave,
   the control signal generation unit is configured to modulate the high-frequency wave in accordance with an input signal to thereby generate the control signal,
   the control signal includes a first control signal and a second control signal,
   the drive signal includes a first drive signal and a second drive signal,
   the insulation unit includes a second insulation element, a third insulation element, a second rectification unit, and a third rectification unit,
   the second insulation element is configured to isolatedly transmit the first control signal,
   the second rectification unit is configured to rectify the isolatedly transmitted first control signal to thereby generate the first drive signal,
   the third insulation element is configured to isolatedly transmit the second control signal,
   the third rectification unit is configured to rectify the isolatedly transmitted second control signal to thereby generate the second drive signal,
   the output selection unit includes a first switching element and a second switching element,
   an on/off state of the first switching element is switched by the first drive signal,
   an on/off state of the second switching element is switched by the second drive signal,
   a conducting/non-conducting state between the power source unit and the output terminal changes according to the on/off states of the first switching element and the second switching element, thereby selecting whether or not the output signal is output from the output terminal,
   when the power source unit and the output terminal are in the conducting state, the output signal is output from the output terminal, and the control signal adjustment unit is configured to adjust at least one of the first control signal or the second control signal upon the first detection signal being input.

4. The signal generation device according to claim 1, wherein the first detection unit includes a first detection terminal and a first detection circuit,
the first detection terminal is connected to the transmission unit, and
the first detection circuit is configured to generate the first detection signal on the basis of the detection wave that is input from the first detection terminal.

5. The signal generation device according to claim 4, wherein the input wave is a high-frequency wave,
a high-frequency wave component is included in the detection wave,
the first detection circuit includes a rectification unit, and
the first detection circuit is configured to generate the first detection signal by the high-frequency wave component being rectified by the rectification unit.

6. The signal generation device according to claim 1, wherein the input wave is a high-frequency wave,
the power source unit includes a first rectification unit and a charge accumulation element,
the first rectification unit is configured to rectify the output wave to thereby generate a charging voltage,
the charge accumulation element is charged by the charging voltage,
the power source voltage is a discharge voltage of the charge accumulation element,
the output selection unit includes a first switching element,
a conducting/non-conducting state between the charge accumulation element and the output terminal changes according to an on/off state of the first switching element, and,
when the charge accumulation element and the output terminal are in the conducting state, the output signal is output from the output terminal.

7. The signal generation device according to claim 1, wherein the input wave is a high-frequency wave,
the first insulation element is an electromagnetic resonance coupler,
the electromagnetic resonance coupler includes transmission-side wiring and a reception-side wiring opposing the transmission-side wiring,
the transmission unit is the transmission-side wiring, and
the reception unit is the reception-side wiring.

8. The signal generation device according to claim 1, further comprising:
an input-wave adjustment unit,
wherein the first detection signal is input to the input-wave adjustment unit,
the input-wave adjustment unit is configured to perform an adjustment of the input wave in accordance with the first detection signal, and
the output signal is adjusted in accordance with the adjustment of the input wave by the input-wave adjustment unit.

9. The signal generation device according to claim 8, wherein, when the output signal is equal to or less than a predetermined voltage value, the first detection unit is configured to generate a first abnormality signal as the first detection signal,
the input-wave adjustment unit is configured to perform an amplification of the input wave upon the first abnormality signal being input, and
the output signal becomes higher than the predetermined voltage value in accordance with the amplification of the input wave by the input-wave adjustment unit.

10. The signal generation device according to claim 1, further comprising:
a second detection unit configured to generate a second detection signal corresponding to the output signal; and
a second adjustment unit configured to adjust the output signal on the basis of the second detection signal.

11. The signal generation device according to claim 10, wherein, when the output signal is equal to or less than a predetermined voltage value, the second detection unit is configured to generate a second abnormality signal as the second detection signal, and,
upon the second abnormality signal being input, the second adjustment unit is configured to stop outputting of the output signal to the output terminal.

* * * * *